(12) United States Patent
Lim et al.

(10) Patent No.: US 11,462,930 B2
(45) Date of Patent: Oct. 4, 2022

(54) METHOD AND DEVICE FOR CONTROLLING CHARGING ON BASIS OF STATE OF BATTERY

(71) Applicant: Samsung Electronics Co., Ltd., Gyeonggi-do (KR)

(72) Inventors: Ho Yeong Lim, Gyeonggi-do (KR); Yong Seung Yi, Seoul (KR); Du Hyun Kim, Gyeonggi-do (KR); Hyun Seok Kim, Gyeonggi-do (KR); Dong Il Son, Gyeonggi-do (KR)

(73) Assignee: Samsung Electronic Co., LTD., Suwon-si (KR)

( * ) Notice: Subject to any disclaimer, the term of this patent is extended or adjusted under 35 U.S.C. 154(b) by 141 days.

(21) Appl. No.: 16/647,550

(22) PCT Filed: Sep. 18, 2018

(86) PCT No.: PCT/KR2018/011003
§ 371 (c)(1),
(2) Date: Mar. 16, 2020

(87) PCT Pub. No.: WO2019/054851
PCT Pub. Date: Mar. 21, 2019

(65) Prior Publication Data
US 2020/0220371 A1     Jul. 9, 2020

(30) Foreign Application Priority Data

Sep. 18, 2017   (KR) .......................... 10-2017-0119353

(51) Int. Cl.
*H02J 7/00*      (2006.01)
*G01R 31/36*     (2020.01)
(Continued)

(52) U.S. Cl.
CPC .... *H02J 7/007182* (2020.01); *G01R 31/3835* (2019.01); *G01R 31/392* (2019.01);
(Continued)

(58) Field of Classification Search
CPC .. H02J 7/007182; H02J 7/0029; H02J 7/0048; G01R 31/3835; G01R 31/392
(Continued)

(56) References Cited

U.S. PATENT DOCUMENTS 3,838,327 A * 9/1974 Uemichi ............... H02J 7/0031
                                                    320/138
5,672,953 A * 9/1997 Kim ........................ H02J 7/008
                                                    320/163
(Continued)

FOREIGN PATENT DOCUMENTS

EP      09 02522 A2    3/1999
JP    2000-329834 A   11/2000
(Continued)

OTHER PUBLICATIONS

European Search Report dated Oct. 8, 2020.
Office Action dated May 23, 2022.

*Primary Examiner* — John T Trischler
(74) *Attorney, Agent, or Firm* — Cha & Reiter, LLC

(57) ABSTRACT

An electronic device which can control battery charging on the basis of the state of a battery by checking the voltage of a battery and the output voltage of a charging circuit, while the battery is being charged in a constant current state, and determining the state of the battery on the basis of at least the voltage of the battery and the output voltage of the charging circuit. Other various embodiments identified in the description are possible.

15 Claims, 17 Drawing Sheets

(51) Int. Cl.
  *G01R 31/392* (2019.01)
  *G01R 31/3835* (2019.01)
(52) U.S. Cl.
  CPC .......... *H02J 7/0029* (2013.01); *H02J 7/0048* (2020.01); *H02J 7/007184* (2020.01)
(58) Field of Classification Search
  USPC ........................................................ 320/162
  See application file for complete search history.

(56) References Cited

U.S. PATENT DOCUMENTS

| | | | | |
|---|---|---|---|---|
| 6,127,810 | A * | 10/2000 | Sato | H02J 7/0086 320/148 |
| 6,344,733 | B1 * | 2/2002 | Crass | H02J 7/0047 320/143 |
| 6,433,510 | B1 * | 8/2002 | Ribellino | H02J 7/0072 320/128 |
| 6,967,469 | B2 * | 11/2005 | Yamamoto | H02J 7/04 320/137 |
| 7,235,953 | B2 * | 6/2007 | Aoyama | G01R 31/58 320/123 |
| 7,449,862 | B1 * | 11/2008 | Voor | H02J 7/0068 320/107 |
| 7,479,765 | B2 * | 1/2009 | Kamatani | H02J 7/0036 320/164 |
| 7,592,716 | B2 * | 9/2009 | Zhu | H02J 9/061 307/48 |
| 7,629,710 | B2 * | 12/2009 | Tonicello | H02J 7/35 307/86 |
| 7,671,564 | B2 * | 3/2010 | Kamatani | H02J 7/0036 320/128 |
| 7,834,581 | B2 * | 11/2010 | Kim | H01M 10/44 320/103 |
| 8,330,427 | B2 * | 12/2012 | Taniguchi | H01M 10/486 320/162 |
| 8,698,628 | B2 * | 4/2014 | Byun | G09F 3/208 340/572.1 |
| 9,118,266 | B2 * | 8/2015 | Chuang | B60L 58/21 |
| 9,172,253 | B2 * | 10/2015 | An | H02J 7/007182 |
| 9,190,861 | B2 * | 11/2015 | Kim | B60L 50/62 |
| 9,198,292 | B2 * | 11/2015 | Kim | H05K 1/148 |
| 9,229,064 | B2 * | 1/2016 | Chou | G01R 31/392 |
| 9,246,331 | B2 * | 1/2016 | Hidaka | H02J 1/108 |
| 9,263,908 | B2 * | 2/2016 | Ju | H01M 10/42 |
| 9,343,914 | B2 * | 5/2016 | Dwertmann | B60L 58/19 |
| 9,350,189 | B2 * | 5/2016 | Kim | B60L 58/15 |
| 9,893,540 | B2 | 2/2018 | Zhang et al. | |
| 9,912,180 | B2 * | 3/2018 | Oh | H02J 7/0031 |
| 9,935,476 | B2 | 4/2018 | Zhang et al. | |
| 9,948,217 | B2 * | 4/2018 | Chuang | B60L 58/21 |
| 9,979,220 | B2 * | 5/2018 | Jung | H02J 7/007 |
| 10,097,035 | B2 * | 10/2018 | Harada | H02J 7/022 |
| 10,103,562 | B2 * | 10/2018 | Lee | H02J 7/007182 |
| 10,122,190 | B2 * | 11/2018 | Zhang | H02J 7/0029 |
| 10,320,206 | B2 * | 6/2019 | Zhang | H02J 7/0069 |
| 10,471,836 | B2 * | 11/2019 | Yabuuchi | H02J 7/0071 |
| 10,479,209 | B2 * | 11/2019 | Yabuuchi | B60L 53/18 |
| 10,530,167 | B2 * | 1/2020 | Yi | H02J 7/007182 |
| 10,637,268 | B2 * | 4/2020 | Khandelwal | H02J 7/007 |
| 10,666,072 | B2 * | 5/2020 | Zhang | H01R 31/06 |
| 10,775,872 | B2 * | 9/2020 | Kim | G06F 1/263 |
| 10,868,428 | B2 * | 12/2020 | Stickel | H01M 10/425 |
| 11,114,881 | B2 * | 9/2021 | Jeong | H02J 7/0031 |
| 11,177,684 | B2 * | 11/2021 | Xiao | H01M 10/441 |
| 2004/0095095 | A1 * | 5/2004 | Yamamoto | H02J 7/06 320/128 |
| 2006/0108987 | A1 * | 5/2006 | Aoyama | G01R 31/54 322/99 |
| 2007/0139005 | A1 * | 6/2007 | Osawa | H02J 7/0029 320/115 |
| 2008/0129119 | A1 * | 6/2008 | Tonicello | H02J 7/35 307/39 |
| 2008/0246433 | A1 * | 10/2008 | Kim | H01M 10/44 320/103 |
| 2009/0146613 | A1 * | 6/2009 | Yang | H02J 7/0086 320/139 |
| 2009/0184685 | A1 * | 7/2009 | Sim | H02J 7/0086 320/134 |
| 2009/0189571 | A1 * | 7/2009 | Lai | H02M 1/4225 320/162 |
| 2010/0156351 | A1 * | 6/2010 | Ugaji | H01M 10/44 320/132 |
| 2010/0231175 | A1 * | 9/2010 | Noda | H01M 16/006 320/162 |
| 2010/0283427 | A1 * | 11/2010 | Sugiyama | H01M 16/00 320/118 |
| 2010/0327818 | A1 * | 12/2010 | Taniguchi | H01M 10/486 320/162 |
| 2012/0013467 | A1 * | 1/2012 | Byun | H01M 10/482 340/572.1 |
| 2012/0206111 | A1 * | 8/2012 | Park | H02J 7/0029 320/163 |
| 2012/0212046 | A1 * | 8/2012 | Goto | F02D 29/02 307/9.1 |
| 2012/0223672 | A1 * | 9/2012 | Liu | H02J 7/04 320/107 |
| 2013/0166234 | A1 * | 6/2013 | Chou | G01R 31/392 702/63 |
| 2013/0187611 | A1 * | 7/2013 | Suzuki | H02J 7/0018 320/118 |
| 2013/0249219 | A1 * | 9/2013 | Kim | F02N 11/0866 290/36 R |
| 2013/0249492 | A1 * | 9/2013 | Kim | H02J 7/0063 320/128 |
| 2013/0302651 | A1 * | 11/2013 | Kim | H05K 1/0263 429/7 |
| 2013/0314095 | A1 * | 11/2013 | Nakashima | G01R 31/382 324/433 |
| 2013/0341923 | A1 * | 12/2013 | Ju | B60L 58/12 290/48 |
| 2014/0167705 | A1 * | 6/2014 | Chang | H02J 7/0021 320/157 |
| 2014/0191692 | A1 * | 7/2014 | Chuang | H02P 4/00 318/139 |
| 2014/0340052 | A1 * | 11/2014 | Dwertmann | H02J 7/0024 320/162 |
| 2015/0077058 | A1 * | 3/2015 | Jung | H02J 7/008 320/112 |
| 2015/0200560 | A1 * | 7/2015 | Oh | H02J 7/0047 320/164 |
| 2016/0020620 | A1 * | 1/2016 | Lee | H02J 7/008 320/162 |
| 2016/0072313 | A1 * | 3/2016 | Satou | H02J 7/007 320/162 |
| 2016/0072414 | A1 * | 3/2016 | Chuang | H02P 9/00 318/139 |
| 2016/0226275 | A1 * | 8/2016 | Kim | H02J 7/0031 |
| 2016/0254688 | A1 * | 9/2016 | Jung | H02J 7/007 320/164 |
| 2016/0344210 | A1 * | 11/2016 | Zhang | H02J 7/007 |
| 2016/0344211 | A1 * | 11/2016 | Zhang | H02J 7/007 |
| 2017/0155276 | A1 * | 6/2017 | Harada | H02J 7/022 |
| 2017/0184676 | A1 * | 6/2017 | Shimizu | H02J 7/0016 |
| 2017/0279288 | A1 * | 9/2017 | Kimura | H02J 7/0072 |
| 2018/0191179 | A1 * | 7/2018 | Yi | H02J 7/0044 |
| 2018/0215278 | A1 * | 8/2018 | Yabuuchi | B60L 53/60 |
| 2018/0236888 | A1 * | 8/2018 | Yabuuchi | H02J 7/00 |
| 2018/0260019 | A1 * | 9/2018 | Kim | G06F 1/3287 |
| 2019/0036361 | A1 * | 1/2019 | Zhang | H02J 7/02 |
| 2019/0067969 | A1 * | 2/2019 | Blum | H02J 7/0072 |
| 2019/0229547 | A1 * | 7/2019 | Lim | H01M 10/425 |
| 2019/0260211 | A1 * | 8/2019 | Zhang | H01R 31/06 |
| 2019/0280486 | A1 * | 9/2019 | Cheng | H01M 10/44 |
| 2019/0393702 | A1 * | 12/2019 | Su | H02M 3/156 |
| 2020/0099229 | A1 * | 3/2020 | Jeong | G05F 1/461 |
| 2020/0112178 | A1 * | 4/2020 | Jung | H02J 7/00714 |
| 2020/0185956 | A1 * | 6/2020 | Xiao | H02J 7/00714 |
| 2020/0328608 | A1 * | 10/2020 | Song | H02J 7/04 |
| 2020/0386819 | A1 * | 12/2020 | Lee | G01R 31/367 |

(56) References Cited

U.S. PATENT DOCUMENTS

| | | | |
|---|---|---|---|
| 2021/0057921 A1* | 2/2021 | Lim | H02J 7/0029 |
| 2021/0226455 A1 | 7/2021 | Zhang | |
| 2022/0140634 A1 | 5/2022 | Zhang et al. | |

FOREIGN PATENT DOCUMENTS

| | | | | |
|---|---|---|---|---|
| JP | 2002131403 A * | 5/2002 | | H02J 7/00302 |
| JP | 2003-17138 A | 1/2003 | | |
| JP | 2004-222427 A | 8/2004 | | |
| JP | 2005039919 A * | 2/2005 | | H02J 7/00304 |
| JP | 3713828 B2 * | 11/2005 | | |
| JP | 2010038592 A * | 2/2010 | | |
| JP | 6097678 B2 | 2/2017 | | |
| KR | 10-2015-0084316 A | 7/2015 | | |
| KR | 10-2016-0009321 A | 1/2016 | | |
| KR | 10-2016-0135711 A | 11/2016 | | |
| KR | 10-2017-0062133 A | 6/2017 | | |
| KR | 10-2017-0062766 A | 6/2017 | | |

\* cited by examiner

METHOD AND DEVICE FOR CONTROLLING CHARGING ON BASIS OF STATE OF BATTERY

CROSS REFERENCE TO RELATED APPLICATIONS

This application is a National Phase Entry of PCT International Application No. PCT/KR2018/011003, which was filed on Sep. 18, 2018, and claims a priority to Korean Patent Application No. 10-2017-0119353, which was filed on Sep. 18, 2017, the contents of which are incorporated herein by reference.

TECHNICAL FIELD

The present disclosure relates to a technology for charging a battery included in an electronic device by using a power received from an external power source of the electronic device.

BACKGROUND ART

With the development of electronic technologies, various types of electronic products are being developed and distributed. In particular, the supply of a portable electronic device, such as a smartphone, a tablet personal computer (PC), or the like, is being expanded.

In general, the portable electronic device uses a battery, which is embedded in the electronic device or is detachable, as a power supply source. A technology for increasing the capacity of the battery is being developed; however, the capacity of the battery is restrictive, and a user needs to charge the battery by using a charging device in the case where the remaining capacity of the battery is insufficient.

DISCLOSURE

Technical Problem

An electronic device, which uses the battery, such as a smartphone may charge the battery by using the charging device. For example, the charging device may be placed outside the electronic device and may supply a power to the electronic device through a connector. Also, the electronic device may control charging based on a voltage of the battery. However, for example, in the case where the connector is incompletely inserted, an inexact battery voltage may be measured. In this case, the electronic device may control charging based on the inexact battery voltage. This causes incomplete charging, charging delay, and/or overheating of the electronic device. Also, as the battery is repeatedly charged and discharged, a charging and discharging characteristic of the battery may be changed. In this case, specified battery charging control parameters may not correspond to a present characteristic of the battery.

In a conventional charging method, the electronic device may control charging based only on a voltage of the battery. For example, the electronic device may selectively perform constant current (CC) charging or constant voltage (CV) charging based on the voltage of the battery. However, in the above-described non-ideal charging situation, the issues, such as incomplete charging, charging delay, and/or overheating of the electronic device, cannot be solved through the charging control only based on the battery voltage.

Aspects of the present disclosure are to address at least the above-mentioned problems and/or disadvantages and to provide at least the advantages described below. Accordingly, an aspect of the present disclosure is to provide an apparatus and a method which may detect a non-ideal charging situation and may charge a battery depending on battery status.

Technical Solution

In accordance with an aspect of the present disclosure, an electronic device may include a battery, a first detection circuit that detects a voltage of the battery, a charging circuit that charges the battery in a constant current state or a constant voltage state based on the voltage of the battery, a second detection circuit that detects an output voltage of the charging circuit, and a processor. The processor may verify the voltage of the battery by using the first detection circuit and the output voltage by using the second detection circuit, while the battery is charged in the constant current state, and may determine a state of the battery based at least on the voltage of the battery and the output voltage.

In accordance with another aspect of the present disclosure, an electronic device may a battery, a first detection circuit that detects a voltage of the battery, a charging circuit that charges the battery in a constant current state or a constant voltage state based on the voltage of the battery, a second detection circuit that detects an output voltage of the charging circuit, a display, and a processor. The processor may periodically verify the voltage of the battery and the output voltage by using the first detection circuit and the second detection circuit, respectively, while the battery is charged in the constant current state, and may provide information about a charging state of the battery through the display based on at least one of a difference between the voltage of the battery and the output voltage, the change in the voltage of the battery periodically verified, or the change in the output voltage periodically verified. In accordance with another aspect of the present disclosure, an electronic device may include a battery, a first detection circuit that detects a voltage of the battery, a charging circuit that charges the battery in a constant current state or a constant voltage state based on the voltage of the battery, a second detection circuit that detects an output voltage of the charging circuit, and a processor. The processor is may verify the voltage of the battery and the output voltage by using the first detection circuit and the second detection circuit, respectively, while the battery is charged in the constant current state, may charge the battery in the constant current state or the constant voltage state depending on a first reference by using the charging circuit, when a difference between the output voltage and the battery voltage is not greater than a specified value, and may charge the battery in the constant current state or the constant voltage state depending on a second reference different from the first reference by using the charging circuit, when the difference between the output voltage and the battery voltage exceeds the specified value. The first reference may include a first battery voltage value.

Advantageous Effects

According to embodiments of the present disclosure, abnormal charging of an electronic device may be previously prevented.

Also, according to various embodiments, more efficient charging may be performed by supplying an appropriate power to a battery of the electronic device.

Besides, a variety of effects directly or indirectly understood through this disclosure may be provided.

DESCRIPTION OF DRAWINGS

With regard to description of drawings, similar components may be marked by similar reference numerals.

MODE FOR INVENTION

Hereinafter, various embodiments of the present disclosure may be described with reference to accompanying drawings. Accordingly, those of ordinary skill in the art will recognize that modification, equivalent, and/or alternative on the various embodiments described herein can be variously made without departing from the scope and spirit of the present disclosure.

Components of an electronic device 100 will be described with reference to FIG. 1.

Figure 1:
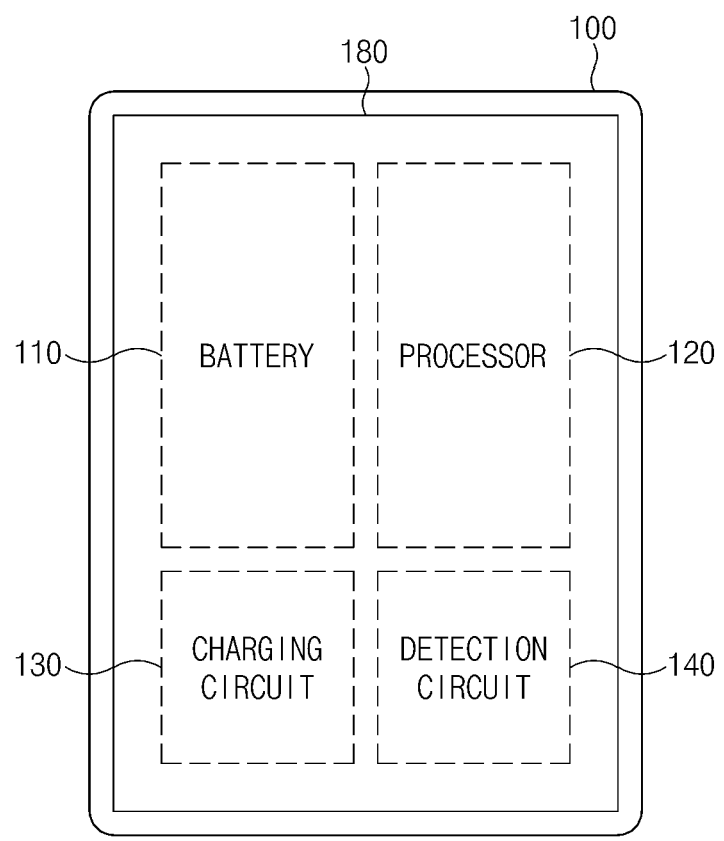
FIG. 1 is a block diagram of an electronic device according to an embodiment.

FIG. 1 is a block diagram of an electronic device according to an embodiment.

In an embodiment, the electronic device 100 may include a battery 110, a processor 120, a charging circuit 130, and a detection circuit 140. Also, in an embodiment, the electronic device 100 may include at least one output circuit. The at least one output circuit may provide, for example, a visual, auditory, and/or tactile output. In an embodiment, the electronic device 100 may include a display 180 as the at least one output circuit.

In an embodiment, the battery 110 may include one or more charging cells. Also, the battery 110 may supply the power to any other components of the electronic device 100. In an embodiment, the battery 110 may further include various other electronic elements (e.g., a protection circuit module (or a battery protection circuit)). According to various embodiments, the battery 110 may be detachable from the electronic device 100.

In an embodiment, the processor 120 may control other components (e.g., the battery 110, the charging circuit 130, the detection circuit 140, the display 180, and/or any other components (not illustrated)) of the electronic device 100.

In an embodiment, the charging circuit 130 may control an output power (e.g., an output voltage and/or an output current) of the charging circuit 130 based on a voltage of the battery 110. Also, the charging circuit 130 may be controlled by the processor 120 of the electronic device 100.

In an embodiment, the detection circuit 140 may measure the voltage of the battery 110. For example, the detection circuit 140 may detect the voltage of the battery 110 by measuring a voltage across an anode and a cathode of the battery 110. For example, the detection circuit 140 may detect the voltage of the battery 110 periodically or randomly. Also, the detection circuit 140 may provide the detected voltage to the charging circuit 130 and/or the processor 120.

In an embodiment, the detection circuit 140 may detect an output voltage of the charging circuit 130 periodically or randomly. Also, the detection circuit 140 may provide the detected voltage to the charging circuit 130 and/or the processor 120.

In an embodiment, the detection circuit 140 may detect a charging amount (e.g., a state of charging (SoC)) of the battery 110 periodically or randomly. Also, the detection circuit 140 may provide the detected charging amount to the charging circuit 130 and/or the processor 120.

In an embodiment, the detection circuit 140 may detect the voltage of the battery 110, the charging amount of the battery 110, and/or the output voltage of the charging circuit 130 periodically or in response to a request. The voltage of the battery 110, the charging amount of the battery 110, and/or the output voltage of the charging circuit 130 may be detected at the same time or at different times. Also, the detection circuit 140 may provide the processor 120 and/or the charging circuit 130 with information about the voltage of the battery 110, the charging amount of the battery 110, and/or the output voltage of the charging circuit 130 periodically or in response to a request.

Below, various embodiments of the electronic device 100 will be described with reference to the above-described components of the electronic device 100.

In a conventional charging control method, a switch to a constant voltage charging state may be determined based on the voltage of the battery 110. However, an abnormal charging situation may happen due to a change in an internal and/or external impedance of the battery 110. Also, for example, a constant current charging state may be switched to the constant voltage charging state due to a recognition error associated with the voltage of the battery 110.

In an embodiment, while the battery 110 is charged in a constant current state, the processor 120 may obtain or verify the voltage of the battery 110 and the output voltage of the charging circuit 130 by using the detection circuit 140. For example, the processor 120 may obtain or verify the voltage of the battery 110 and the output voltage of the charging circuit 130 at a specified time interval. In an embodiment, a state of the battery 110 may be defined based on the voltage of the battery 110 and the output voltage of the charging circuit 130. For example, the processor 120 may determine the state of the battery 110 based on the voltage of the battery 110 and the output voltage of the charging circuit 130.

In an embodiment, the state of the battery 110 may be determined as a normal charging state or an abnormal charging state based at least on a difference between the voltage of the battery 110 and the output voltage of the charging circuit 130. For example, during the constant current charging state, in the case where the difference between the voltage of the battery 110 and the output voltage of the charging circuit 130 is smaller than a specified first value, the state of the battery 110 may be referenced as the normal charging state. Also, for example, during the constant current charging state, in the case where the difference between the voltage of the battery 110 and the output voltage of the charging circuit 130 is smaller than the first value, the state of the battery 110 may be referenced as the abnormal charging state.

In an embodiment, the electronic device 100 may determine the state of the battery 110 based on at least one of a change in the voltage of the battery 110 or a change in the output voltage of the charging circuit 130 verified/obtained at the specified time interval. For example, the change in the voltage of the battery 110 or the change in the output voltage of the charging circuit 130 may include at least one of a difference between a previously verified value and a presently verified value, a rate of change per hour, or a change in an average in each time interval. For example, the processor 120 may determine the state of the battery 110 by comparing at least one of the change in the voltage of the battery 110 or the change in the output voltage of the charging circuit 130 with a specified second value. In an embodiment, the processor 120 may determine the state of the battery 110 as the normal charging state when the change in the voltage of the battery 110 is within a threshold range or a threshold ratio from the specified second value, and may determine the state of the battery 110 as the abnormal charging state when the change in the voltage of the battery 110 exceeds the threshold range or the threshold ratio from the specified second value. In an embodiment, the processor 120 may determine the state of the battery 110 as the normal charging state when the change in the output voltage of the charging circuit 130 is within the threshold range or the threshold ratio from the specified second value, and may determine the state of the battery 110 as the abnormal charging state when the change in the output voltage of the charging circuit 130 exceeds the threshold range or the threshold ratio from the specified second value. In an embodiment, the processor 120 may determine the state of the battery 110 as the normal charging state when the changes in the voltage of the battery 110 and the output voltage of the charging circuit 130 are within the threshold range or the threshold ratio from the specified second value, and may determine the state of the battery 110 as an abnormal charging state when the changes in the voltage of the battery 110 and the output voltage of the charging circuit 130 exceed the threshold range or the threshold ratio from the specified second value. In an embodiment, the processor 120 may determine the state of the battery 110 by comparing the change in the voltage of the battery 110 and/or the change in the output voltage of the charging circuit 130 with a specified second range. For example, the threshold range or the threshold ratio from the specified second value of the above-described embodiment may be defined as the specified second range.

Also, in an embodiment, the change in the voltage of the battery 110 or the change in the output voltage of the charging circuit 130 may be associated with a present charging amount of the battery 110. For example, in the above-described embodiment, the specified second value and/or the specified second range may be a value associated with a charging amount of the battery 110. For example, the processor 120 may determine the state of the battery 110 by comparing the specified second value and/or the specified second range associated with the charging amount of the battery 110 with the change in the voltage of the battery 110 or the change in the output voltage of the charging circuit 130.

In an embodiment, in the case where the state of the battery 110 is the normal charging state, the processor 120 may charge the battery 110 in the constant current state or in a constant voltage state based on a specified voltage. For example, in the case where the voltage of the battery 110 is not smaller than the specified value, the processor 120 may charge the battery 110 in the constant voltage state. Also, for example, in the case where the voltage of the battery 110 is smaller than the specified value, the processor 120 may charge the battery 110 in the constant current state.

In an embodiment, in the case where the state of the battery 110 is the abnormal charging state, the processor 120 may charge the battery 110 in the constant current state or in the constant voltage state based on a reference different than in the case of the normal charging state. In an embodiment, the processor 120 may determine whether to perform a constant voltage charging operation in the case of the normal charging state by comparing the battery voltage and/or the output voltage of the charging circuit 130 with a specified third value, and may determine whether to perform a constant voltage charging operation in the case of the abnormal charging state by comparing the battery voltage and/or the output voltage of the charging circuit 130 with a specified fourth value. The specified fourth value may be set to a value which is different from the specified third value. In an embodiment, in the case where the state of the battery 110 is the abnormal charging state, the processor 120 may charge the battery 110 in the constant voltage state regardless of a voltage value of the battery 110. In an embodiment, in the case where the state of the battery 110 is the abnormal charging state, the processor 120 may charge the battery 110 with a current, the level of which is lower than in the normal charging state. In an embodiment, in the case where the state of the battery 110 is the abnormal charging state, the processor 120 may complete charging based on the voltage of the battery 110, which is different from a voltage of the battery 110 in the normal charging state. For example, the processor 120 may complete or interrupt charging at the voltage of the battery 110, which is lower than in the normal charging state. Also, in an embodiment, in the case where the abnormal charging state is determined, the processor 120 may interrupt the charging of the battery 110.

In an embodiment, in the case where the state of the battery 110 is the abnormal charging state, the processor 120 may determine a cause of the abnormal charging state. For example, the detection circuit 140 may detect (or measure) the internal impedance of the battery 110. In an embodiment, the processor 120 may determine the cause of the abnormal charging state based on a difference between the voltage of the battery 110 and the output voltage of the charging circuit 130, a change in the voltage of the battery 110, a change in the output voltage of the charging circuit 130, and/or an internal impedance of the battery 110. For example, in the case where the internal impedance of the battery 110 is greater than a specified value, the processor 120 may determine that the cause of the abnormal charging state is the internal impedance of the battery 110. Also, for example, in the case where a difference between the voltage of the battery 110 and the output voltage of the charging circuit 130 is greater than a specified value, the processor 120 may determine that the cause of the abnormal charging state is the external impedance of the battery 110.

In an embodiment, in the case where the state of the battery 110 is the abnormal charging state, the processor 120 may provide information about the state of the battery 110 by using the above-described at least one output circuit (e.g., the display 180). For example, the information about the state of the battery 110 may include information indicating at least one of the abnormal charging state, a cause of the abnormal charging state, or an instruction corresponding to the abnormal charging state. The information about the state of the battery 110 may be provided a visual, auditory, and/or tactile notification.

In an embodiment, the processor 120 may train a value for determining the state of the battery 110 and/or a value for controlling a constant voltage charging operation of the battery 110. For example, while a charging operation is performed as much as the specified number of times, the processor 120 may record a parameter associated with a charging control of the battery 110. For example, the parameter associated with the charging control of the battery 110 may include the voltage of the battery 110, the output voltage of the charging circuit 130, a difference between the voltage of the battery 110 and the output voltage of the charging circuit 130, a change in the voltage of the battery 110, and/or a length of a constant voltage charging switching time according to a charging amount. In an embodiment, after a charging operation is performed as much as the specified number of times, the processor 120 may update the value for determining the state of the battery 110 and/or the value for controlling a constant voltage charging operation of the battery 110. For example, the value for determining the state of the battery 110 and/or the value for controlling a constant voltage charging operation of the battery 110 may be a value which is updated based at least on a previously verified parameter associated with a charging control. Below, the components of an electronic device 100 will be more fully described with reference to FIGS. 2 and 3.

Figure 2:
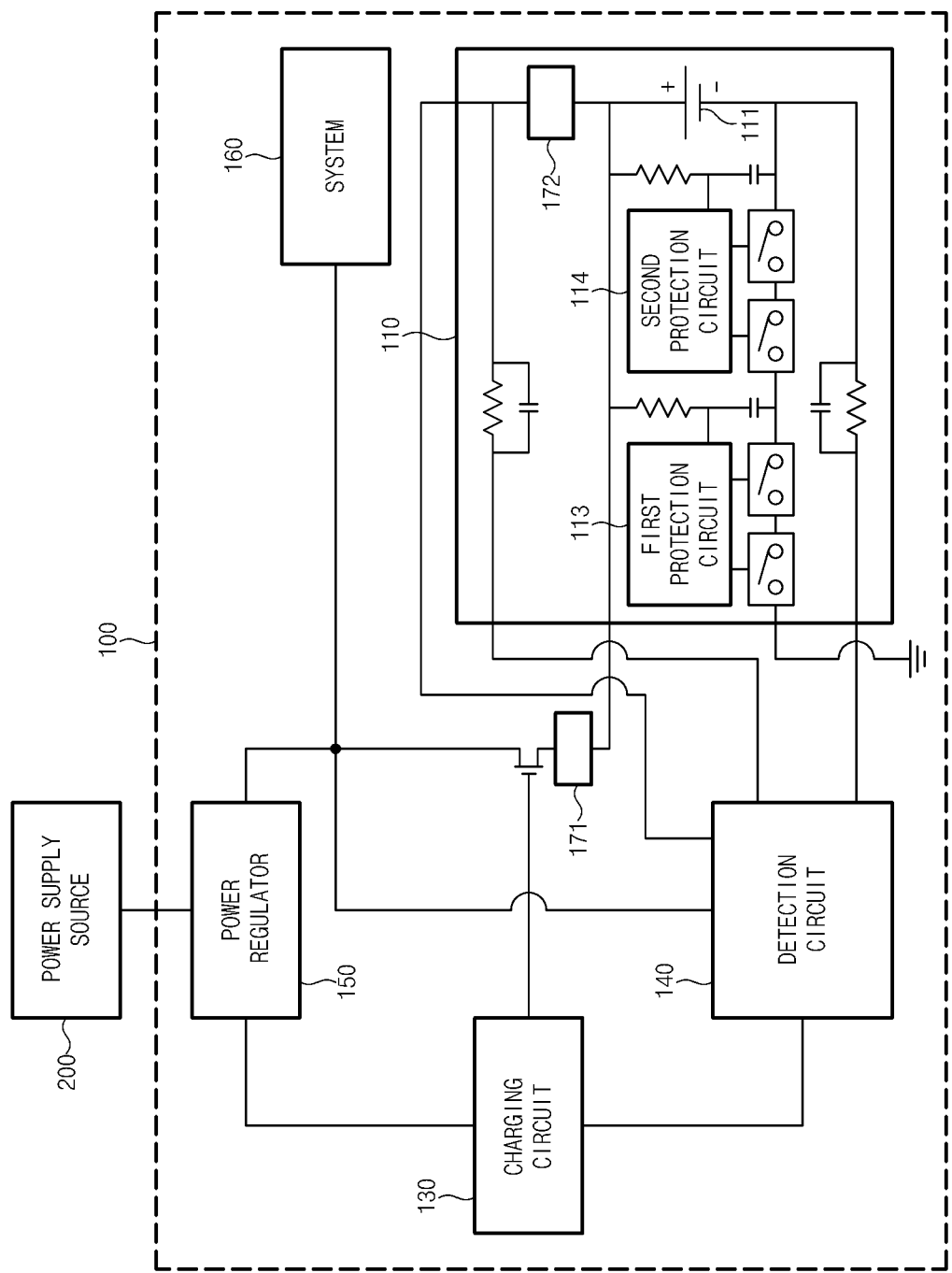
FIG. 2 is a view illustrating a configuration of an electronic device according to an embodiment.

FIG. 2 is a view illustrating a configuration of an electronic device according to an embodiment.

Below, the configuration of the electronic device 100 described with reference to FIG. 1 is omitted for convenience of description. In an embodiment, the electronic device 100 may include a power regulator 150, the charging circuit 130, the detection circuit 140, the battery 110, and a system 160. In an embodiment, the system 160 may include any other components of the electronic device 100. For example, the system 160 may include any other components (e.g., at least one of the remaining components of an electronic device 1201 other than the battery 1289 and the power management module 1288 to be described with reference to FIG. 12) of the electronic device 100 including a processor (e.g., the processor 120 of FIG. 1). In an embodiment, a power supply source 200 may supply a power to the electronic device 100 through a connector on the outside of the electronic device 100. In an embodiment, the power supply source 200 may wirelessly supply the power to the electronic device 100.

In an embodiment, the power regulator 150 may control the power received from the power supply source 200 under control of the charging circuit 130. For example, the power regulator 150 may include a DC-DC converter (e.g., a buck-booster converter).

In an embodiment, the battery 110 may include a battery cell 111, a first protection circuit 113, a second protection circuit 114, a plurality of switches, and a plurality of electronic elements. One battery cell 111 is illustrated in FIG. 2. However, in an embodiment, the battery 110 may include one or more cells. In an embodiment, the first protection circuit 113 and the second protection circuit 114 may prevent overcharging and over-discharging of a related cell (e.g., the battery cell 111). In an embodiment, the battery 110 may include at least one protection circuit. The configuration of the battery 110 of FIG. 2 is exemplary. For example, the battery 110 may further include any other components not illustrated in FIG. 2.

In the embodiment of FIG. 2, a first impedance 171 indicates an impedance corresponding to a result of modeling the outside of the battery 110, and a second impedance 172 indicates an impedance corresponding to a result of modeling the inside of the battery 110. The first impedance 171 corresponds to an abnormal impedance between the charging circuit 130 and the battery 110. For example, the first impedance 171 may increase due to an internal or external factor of the electronic device 100. For example, in the case where a connector for connecting the power supply source 200 and the electronic device 100 is incompletely inserted, the first impedance 171 may be increased. Also, the first impedance 171 may be increased when parts of the electronic device 100 are abnormally installed. Also, the second impedance 172 corresponds to an abnormal impedance which may occur within the battery 110. For example, the second impedance 172 in the battery 110 may be increased by the degradation of performance due to the iteration of charging and discharging of the battery 110 or an external factor.

As described above with regard to FIG. 1, the detection circuit 140 may detect the output voltage of the charging circuit 130, the voltage of the battery 110, and/or a charging amount of the battery 110. In an embodiment, the detection circuit 140 may detect the second impedance 172 in the battery 110. For example, the detection circuit 140 may detect the second impedance 172 in the battery 110 by detecting (or measuring) a voltage and a current of the battery 110. The embodiment is illustrated in FIG. 2 as the detection circuit 140 is implemented with one component, but the detection circuit 140 may be implemented with a plurality of circuits.

Figure 3:
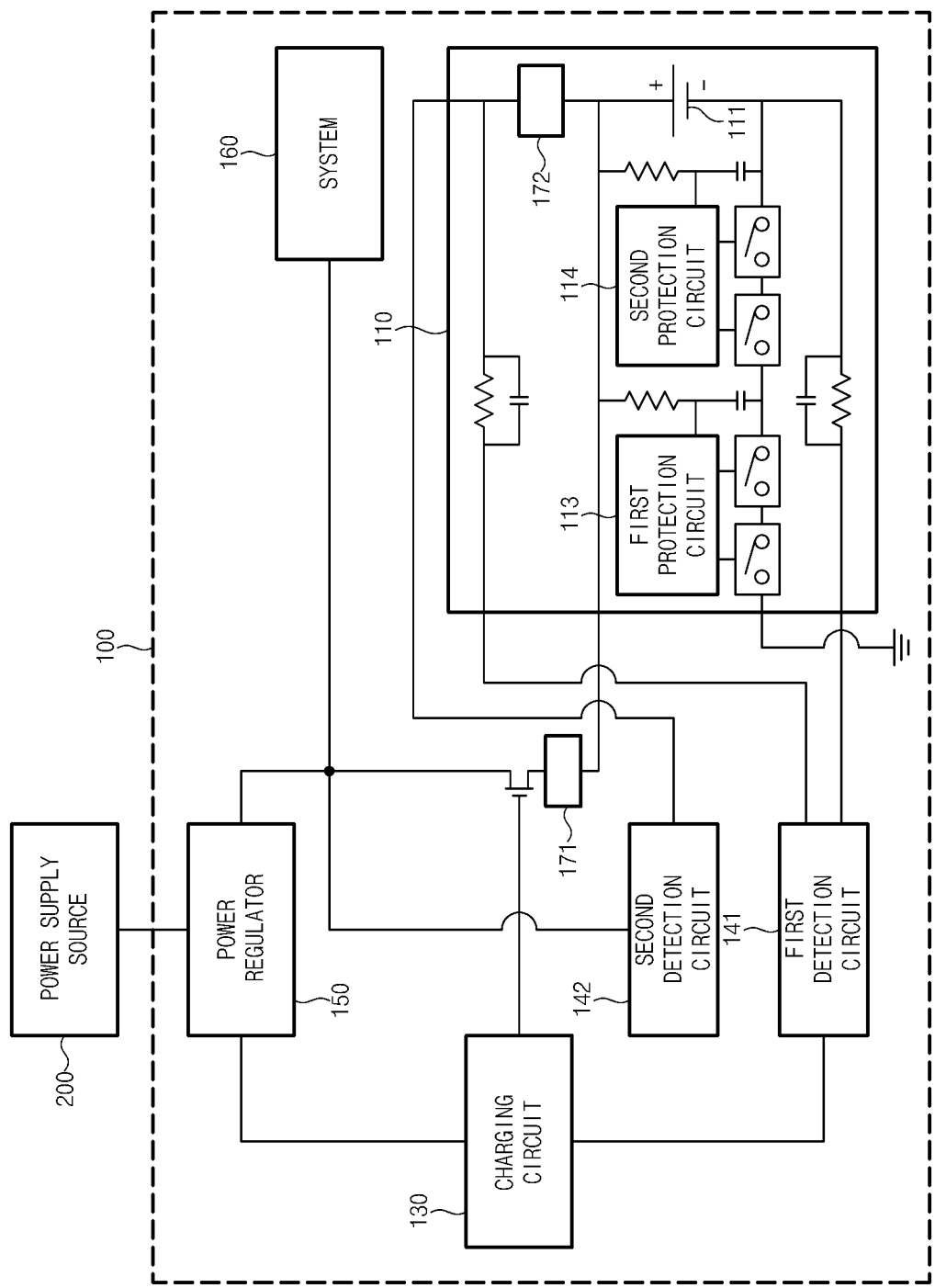
FIG. 3 is a view illustrating a configuration of an electronic device according to another embodiment.

FIG. 3 is a view illustrating a configuration of an electronic device according to another embodiment.

In FIG. 3, descriptions associated with the system 160, the battery 110, the charging circuit 130, and the power supply source 200 may be referenced by the descriptions given with reference to FIGS. 1 and 2. Thus, additional description will be omitted to avoid redundancy.

Referring to FIG. 3, a first detection circuit 141 and a second detection circuit 142 corresponds to the detection circuit 140 of FIG. 2. In an embodiment, the first detection circuit 141 may detect a voltage Vp of the battery 110 periodically or randomly. In an embodiment, the first detection circuit 141 may detect a charging amount of the battery 110. In an embodiment, the second detection circuit 142 may detect an output voltage of the charging circuit 130 periodically or randomly. That is, the second detection circuit 142 may detect a voltage which is applied to the system 160. In an embodiment, a battery voltage and a system voltage may be measured at the same time or at different times. For example, the first detection circuit 141 and the second detection circuit 142 may provide the charging circuit 130 and/or the processor 120 with information including the battery voltage and/or the system voltage periodically or in response to a request.

In an embodiment, the second detection circuit 142 may detect the second impedance 172 in the battery 110. For example, the second detection circuit 142 may detect the second impedance 172 in the battery 110 by using a voltage and a current of the battery 110. The second detection circuit 142 may provide information about the second detection circuit 142 to the charging circuit 130 and/or the processor 120 periodically or in response to a request.

Below, an operation of an electronic device 100 corresponding to the normal charging state will be more fully described with reference to FIGS. 4 and 5. In the following description, a battery voltage may correspond to the voltage of the battery 110 detected by the detection circuit 140, and a charging voltage may correspond to a voltage output from the charging circuit 130. Also, a charging current may correspond to a current output from the charging circuit 130.

Figure 4:
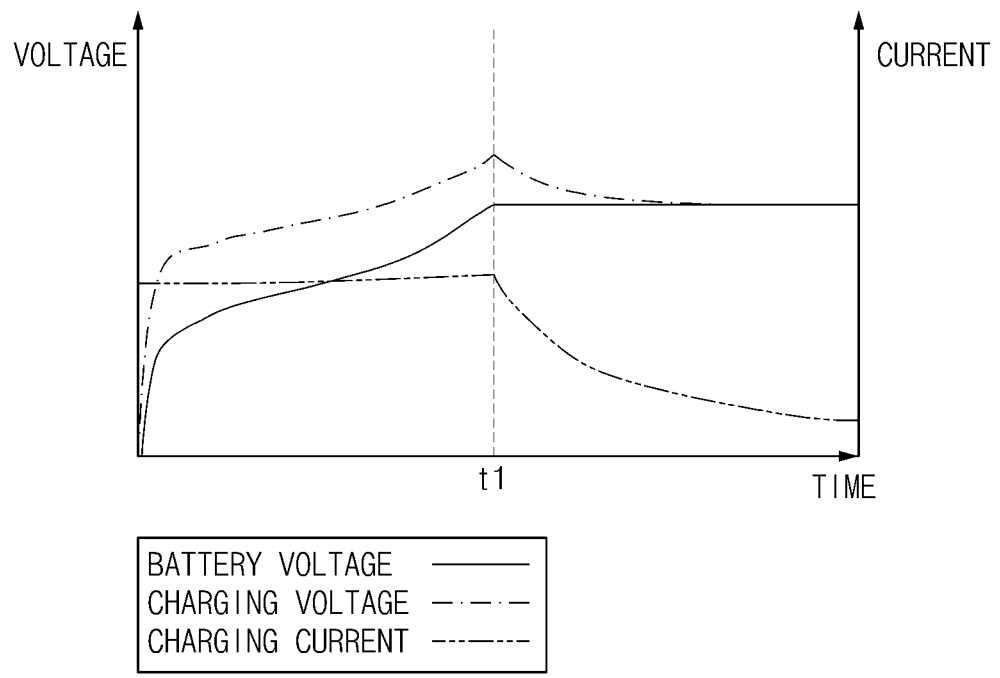
FIG. 4 is a view illustrating a battery voltage, a charging voltage, and a charging current in a normal charging situation according to an embodiment.

FIG. 4 is a view illustrating a battery voltage, a charging voltage, and a charging current in a normal charging situation, according to an embodiment.

Referring to FIG. 4, as charging is performed, a battery voltage is increased until a time t1. For example, in an interval before the time t1, a charging current of a maximum value may be relatively uniformly maintained for the purpose of charging the battery 110 quickly. Accordingly, a time interval before the time t1 may be referenced as a constant current charging interval. After the time t1, the charging current decreases; in contrast, the battery voltage may be maintained relatively uniformly. Accordingly, an interval after the time t1 may be referenced as a constant voltage charging interval. In an embodiment, in the case where the battery voltage is not smaller than a specified value or a specified threshold value, the charging circuit 130 may switch a charging state from the constant current charging state to the constant voltage charging state. For example, the charging circuit 130 may perform constant current charging and constant voltage charging under control of the processor 120.

An electronic element, an integrated circuit, and/or line loss between the charging circuit 130 and the detection circuit 140 may cause an impedance. Since a maximum charging current is maintained in the constant current charging interval, as illustrated in FIG. 4, a difference between the charging voltage and the battery voltage is maximized. Also, the difference between the charging voltage and the battery voltage is gradually decreased as constant voltage charging is made.

Figure 5:
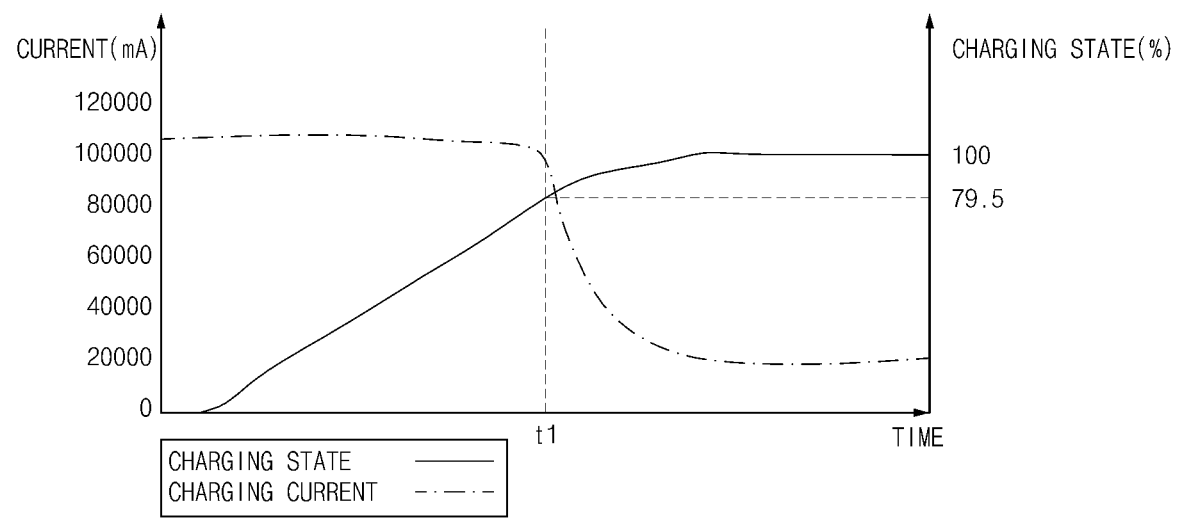
FIG. 5 is a view illustrating a charging state and a charging current in a normal charging situation according to an embodiment.

FIG. 5 is a view illustrating a charging state and a charging current in a normal charging situation, according to an embodiment.

In FIG. 5, a charging state may be changed from the constant current charging state to the constant voltage charging state at a time t1. In the exemplification of FIG. 5, a state of charging (SoC) of the battery 110 is approximately 79.5% when the charging state is changed from the constant current charging state to the constant voltage charging state. That is, in a normal charging situation, since the capacity of the battery 110 is charged to approximately 80%, a decrease of the constant current charging interval may cause a delay of a time when charging is completed.

In the normal charging situation of FIGS. 4 and 5, that a constant current charging operation or a constant voltage charging operation is performed based on a battery voltage is above described. Below, an operation of the electronic device 100 in the abnormal charging state will be described with reference to FIGS. 6A, 6B, and 6C.

Figure 6A:
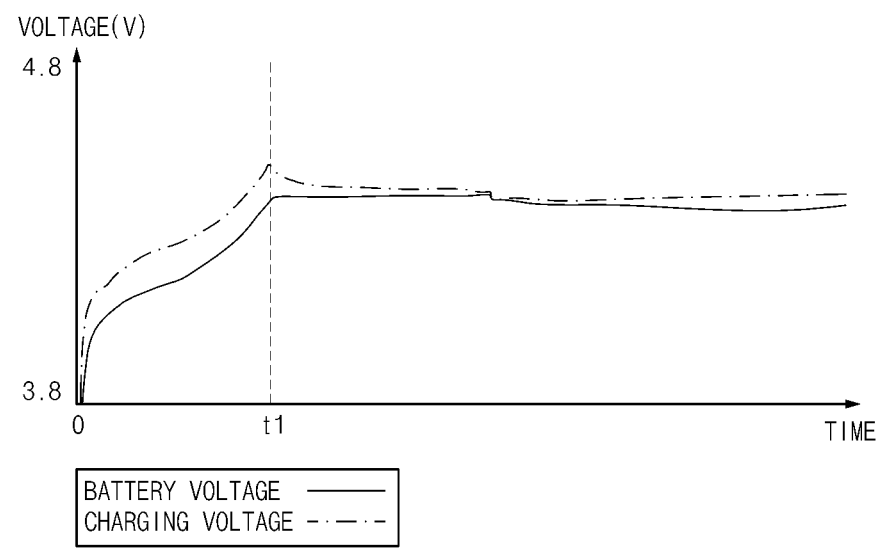
FIG. 6A is a view illustrating a battery voltage and a system voltage in a normal charging situation according to an embodiment.

FIG. 6A is a view illustrating a battery voltage and a system voltage in a normal charging situation according to an embodiment.

As described above, in the case of a normal charging situation, the battery 110 may be charged up to approximately 80% at the time t1. Also, in the normal charging situation, a difference between the system voltage and the battery voltage may be maintained within approximately 10% of the output voltage of the charging circuit 130. Also, for example, a length of a constant current charging interval from a start charging time to the time t1 may be approximately 57 minutes. However, an abnormal charging situation may be caused due to a reason to be described below.

Figure 6B:
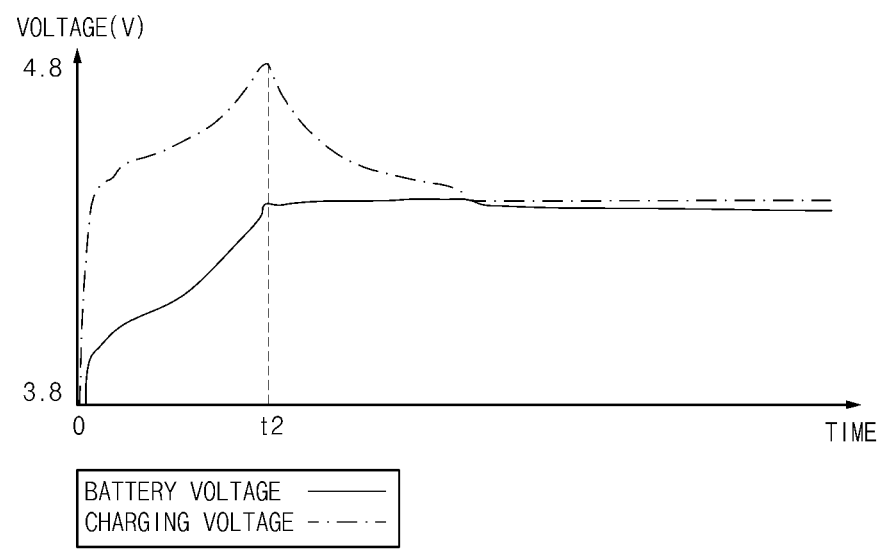
FIG. 6B is a view illustrating an abnormal charging situation according to one exemplification.

FIG. 6B is a view illustrating an abnormal charging situation according to one exemplification.

For convenience of description, FIG. 6B is illustrated by the same scale as FIG. 6A. For example, as described above, an increase in the external impedance (e.g., the first impedance 171) of the battery 110 may cause an abnormal charging situation. Referring to FIG. 6B, the increase in the external impedance (e.g., the first impedance 171) of the battery 110 may make a difference between the battery voltage and the charging voltage greater. For example, at a time t2, a charging state may be switched from the constant current charging state to the constant voltage charging state. Also, for example, a difference between the charging voltage and the battery voltage may correspond to approximately 40% of the output voltage of the charging circuit 130. Also, a length of a constant current charging interval may be approximately 57 minutes. Accordingly, in the abnormal charging situation of FIG. 6B, the charging voltage may be greatly increased. The increase in the charging voltage may cause abnormal heating and failure of the electronic device 100. In addition, a charging time may be increased due to the external impedance.

Accordingly, in an embodiment, as described above, in the case where a difference between the battery voltage and the charging voltage is greater than a specified value, the abnormal charging state may be detected. In this case, the processor 120 may control charging of the battery 110, depending on the above-described embodiments, for the purpose of coping with the abnormal charging state. Also, the processor 120 may provide information about the abnormal charging state, depending on the above-described embodiments. Also, as will be described with reference to FIG. 6C, an increase in the internal impedance of the battery 110 may cause the abnormal charging state.

Figure 6C:
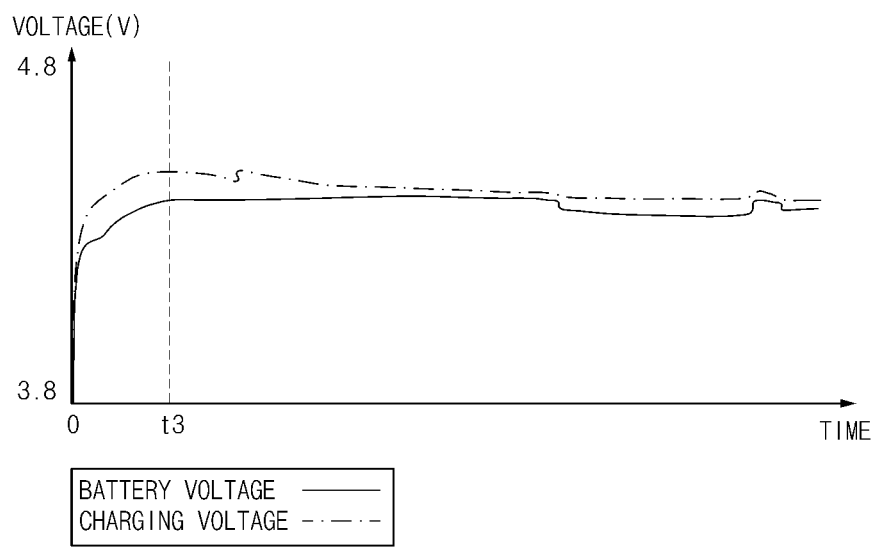
FIG. 6C is a view illustrating an abnormal charging situation, according to another exemplification.

FIG. 6C is a view illustrating an abnormal charging situation according to another exemplification.

For convenience of description, FIG. 6C is illustrated by the same scale as FIG. 6A. For example, an increase in the internal impedance (e.g., the second impedance 172) of the battery 110 may cause an abnormal charging situation. Referring to FIG. 6C, the battery voltage may be very quickly increased due to the increase in the internal impedance of the battery 110. In FIG. 6C, a charging state may be switched from the constant current charging state to the constant voltage charging state at a time t3. In the case where the switch to the constant voltage charging state is performed based on the battery voltage, a constant current charging interval in an abnormal charging situation of FIG.

6C may be short compared to a normal charging situation of FIG. 6A. For example, in the case of FIG. 6C, a length of a constant current charging interval may be approximately 30 minutes. Accordingly, even though a charging state of the battery 110 is low, a charging state may be changed to a constant voltage charging state. This may cause an increase in a charging time of the battery 110.

As described with reference to FIG. 6C, in the abnormal charging situation, the battery voltage and the charging voltage are sharply increased. Accordingly, in an embodiment, as described above, the abnormal charging state may be detected based on a change in the battery voltage and/or a change in the charging voltage. Also, as described with reference to FIG. 6C, in an abnormal charging situation, a constant voltage charging switching time is shorter than a switching time of a normal charging situation. Accordingly, in an embodiment, the abnormal charging state may be detected based on the constant voltage charging switching time. Also, as described above, a charging amount of the battery 110 at the constant voltage charging switching time t3 is lower than in a normal charging situation. Accordingly, in an embodiment, the abnormal charging state may be detected based on the battery voltage and the charging amount of the battery 110. In the case where the abnormal charging state is detected, the processor 120 may control charging of the battery 110, depending on the above-described embodiments, for the purpose of coping with the abnormal charging state. Also, the processor 120 may provide information about the abnormal charging state, depending on the above-described embodiments.

Figure 7A:
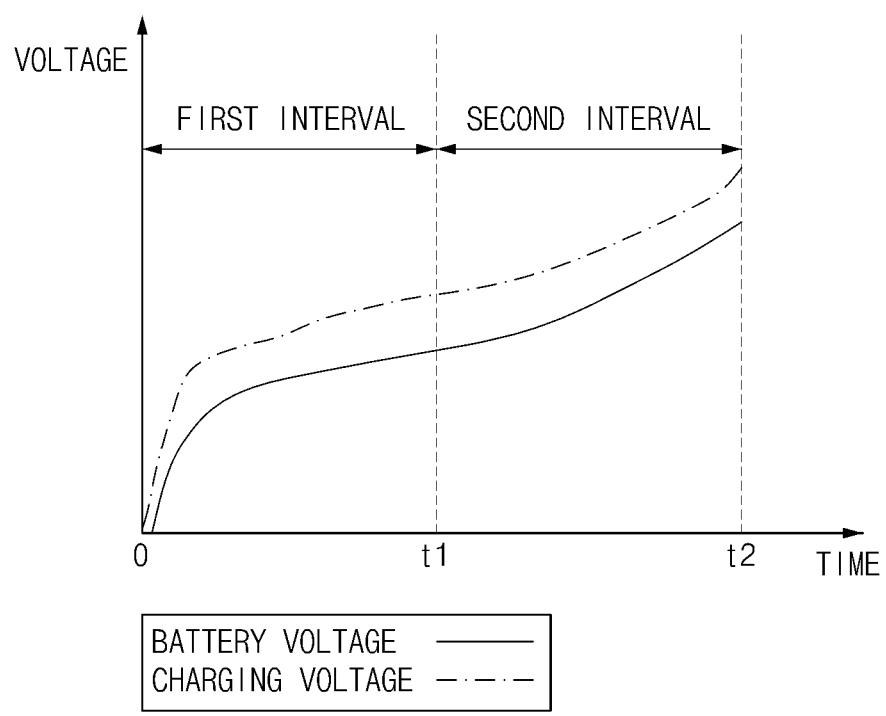
FIG. 7A is a view illustrating a charging state for each interval, according to one exemplification.
Figure 7B:
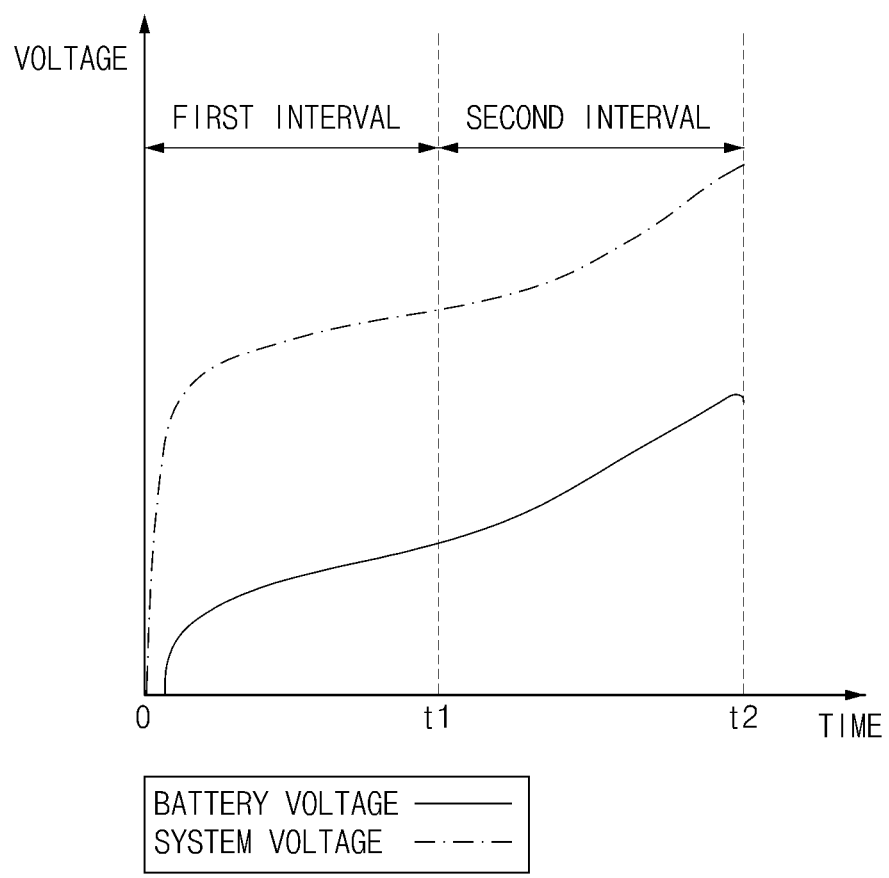
FIG. 7B is a view illustrating a charging state for each interval, according to another exemplification.
Figure 7C:
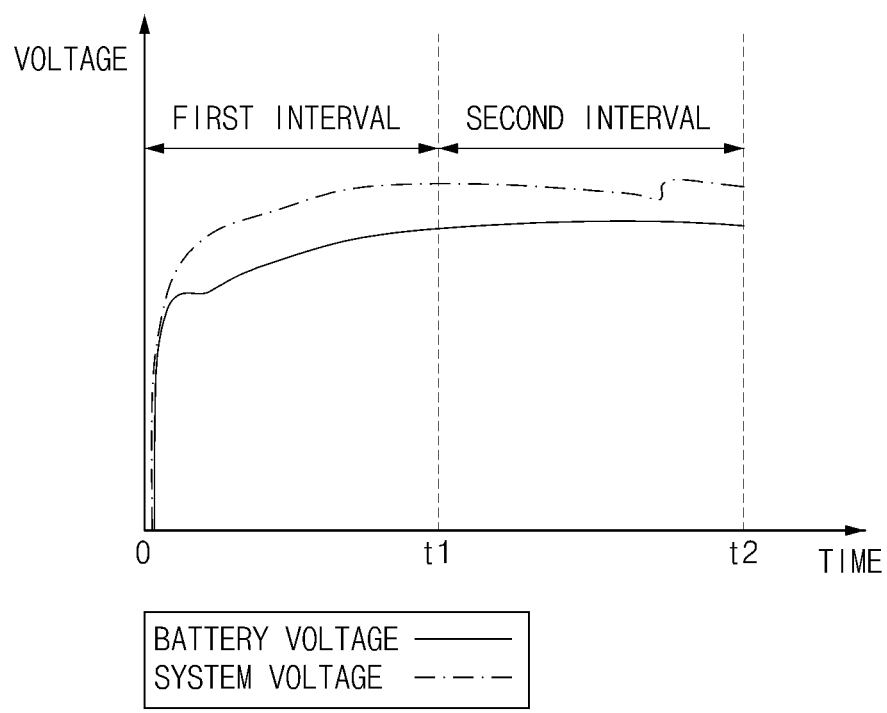
FIG. 7C is a view illustrating a charging state for each interval, according to another exemplification.

Below, changes in the battery voltage and the charging voltage in each charging situation will be more fully described with reference to FIGS. 7A, 7B, and 7C. FIGS. 7A, 7B, and 7C have reference points t1 and t2 on the same time axis.

FIG. 7A is a view illustrating a charging state for each interval according to one exemplification.

FIG. 7A is illustrated as a constant current charging interval of FIG. 6A is expanded two times on a time axis. In FIG. 7A, rates of change of the battery voltage and the charging voltage in a normal charging situation are illustrated for each interval (for respective first and second intervals).

FIG. 7B is a view illustrating a charging state for each interval according to another exemplification.

In FIG. 7B, it is assumed that an abnormal charging situation occurs due to an increase in the external impedance of the battery 110. As illustrated in FIG. 7B, rates of change in the battery voltage and the charging voltage for each interval (for respective first and second intervals) is similar to rates of change in a normal charging situation. However, a difference between the battery voltage and the charging voltage is greater than in the normal charging situation. Accordingly, as described above, an abnormal charging situation may be determined based on a difference between the battery voltage and the charging voltage. Also, the processor 120 may determine a cause of the abnormal charging situation based on the difference between the battery voltage and the charging voltage.

FIG. 7C is a view illustrating a charging state for each interval according to another exemplification.

In FIG. 7C, it is assumed that an abnormal charging situation occurs due to an increase in the internal impedance of the battery 110. As described with reference to FIG. 7C, rates of change of the battery voltage and the charging voltage in the first interval is higher than in a normal charging situation. Also, rates of change of the battery voltage and the charging voltage in the first interval are lower than in a normal charging situation. Accordingly, as described above, an abnormal charging situation may be determined by detecting changes in the battery voltage and the charging voltage at a specified time interval. Also, the processor 120 may determine a cause of the abnormal charging situation based on the change in the battery voltage and/or the charging voltage.

As described with reference to FIGS. 1 to 7C, the charging state and the constant voltage charging operation of the battery 110 may be controlled based on various references. However, for example, the above-described references may be changed by various causes such as degradation of the battery 110 and the electronic device 100. Accordingly, in an embodiment, the references may be trained to cope with the degradation of the battery 110 and the electronic device 100.

Figure 8:
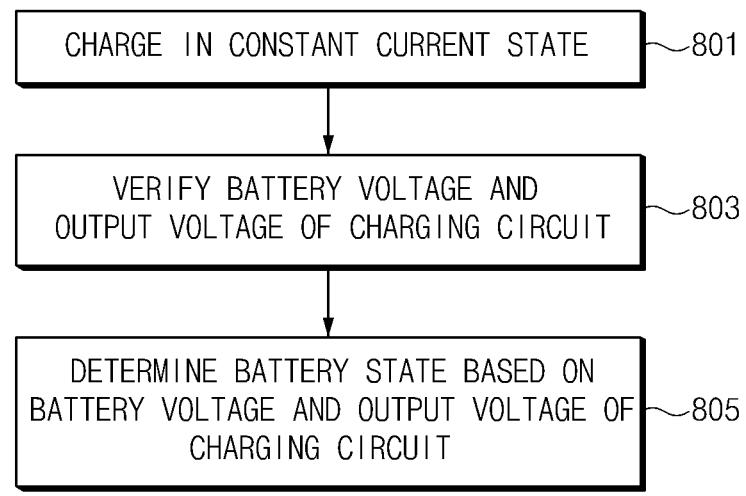
FIG. 8 is a flowchart illustrating a battery status determining method according to various embodiments.

FIG. 8 is a flowchart illustrating a battery status determining method according to various embodiments.

In operation 801, the electronic device 100 (e.g., the processor 120) may charge the battery 110 in the constant current state. For example, the electronic device 100 may perform constant current charging based on a battery voltage. For example, in the case where the voltage of the battery 110 is not smaller than a specified value, the electronic device 100 may charge the battery 110 in the constant current state.

In operation 803, the electronic device 100 (e.g., the processor 120) may verify the battery voltage and an output voltage of the charging circuit 130. In an embodiment, the electronic device 100 may verify the battery voltage and the output voltage of the charging circuit 130 by using the detection circuit 140. Also, in an embodiment, the electronic device 100 may verify the battery voltage and the output voltage of the charging circuit 130 by using the first detection circuit 141 and the second detection circuit 142.

In an embodiment, while constant current charging is performed, the electronic device 100 (e.g., the processor 120) may perform training based on the battery voltage and/or the output voltage of the charging circuit 130. For example, the electronic device 100 may store a training value. For example, the training value may include a difference between the battery voltage and the output voltage of the charging circuit 130, a length of a constant current charging interval, a rate of change of the battery voltage, or a rate of change of the impedance of the battery 110 and/or the output voltage of the charging circuit 130. For example, the difference between the battery voltage and the output voltage of the charging circuit 130 may be stored with regard to a specified charging amount of the battery 110. For example, the length of the constant current charging interval may be stored together with a charging amount of the battery 110 when a constant current charging operation starts and a charging amount of the battery 110 when the constant current charging operation ends. For example, the length of the constant current charging interval may be a time taken to arrive at a battery charging amount of a second value from a battery charging amount of a first value or may be a time from a time at which a battery charging amount corresponds to a third value to a time at which the constant current charging operation ends. For example, the rate of change of the battery voltage and/or the rate of change of the output voltage of the charging circuit 130 may be stored by accumulating respective voltage values at a specified time interval. For example, the rate of change of the battery voltage and/or the rate of change of the output voltage of the charging circuit 130 may be stored as a difference between a previously detected value and a presently detected value.

In an embodiment, the electronic device 100 (e.g., the processor 120) may store the rate of change of the battery voltage and/or the rate of change of the output voltage of the charging circuit 130 in each of a plurality of time intervals. For example, a length of each of the plurality of time intervals may be trained depending on the rate of change of the battery voltage and/or the rate of change of the output voltage of the charging circuit 130. Also, for example, in the case where the rate of change of the battery voltage and/or the rate of change of the output voltage of the charging circuit 130 in one time interval is not smaller than a threshold value, the time interval may be changed to a next time interval.

In an embodiment, the electronic device 100 (e.g., the processor 120) may store the above-described training value at least once or more. For example, in the case where the constant current charging operation is completed once, the training operation may be completed once. In an embodiment, in the case where the training value is trained as much as the specified number of times or more, the electronic device 100 (e.g., the processor 120) may update parameters for controlling battery charging based on the stored training values. In an embodiment, the parameters may be updated based on an average of the training values. Also, in an embodiment, values, which are determined as corresponding to the abnormal charging state, from among the training values may not be stored or may not be used to calculate the average. Also, for example, different weights may be set to the training values, respectively. For example, parameters for controlling charging may include a length of a time interval for measuring the a battery voltage and/or an output voltage of a charging circuit, a difference between the battery voltage and the output voltage for determining a normal charging situation, a change in the battery voltage for determining the normal charging situation and/or a change in the output voltage of the charging circuit for determining the normal charging situation, a difference between the battery voltage and the output voltage according to a battery charging amount, and/or a constant current charging time. Accordingly, the parameters may be updated to cope with the degradation of performance of an electronic device and/or a battery and a change of a characteristic thereof, by using the training values.

In operation 805, the electronic device 100 (e.g., the processor 120) may determine a battery state based on the battery voltage and the output voltage of the charging circuit 130. For example, the electronic device 100 may determine the battery state as the abnormal charging state or the normal charging state. A description associated with determining the battery state may be referenced by the description given with reference to FIGS. 1 to 7C.

Also, in an embodiment, the electronic device 100 (e.g., the processor 120) may charge the battery 110 in the constant voltage state. For example, as described above, the electronic device 100 may perform constant voltage charging based on the battery voltage. Also, as described with reference to the above embodiments, in an abnormal charging situation, an electronic device may charge a battery in the constant voltage state based on a reference different than in a normal charging situation.

Figure 9:
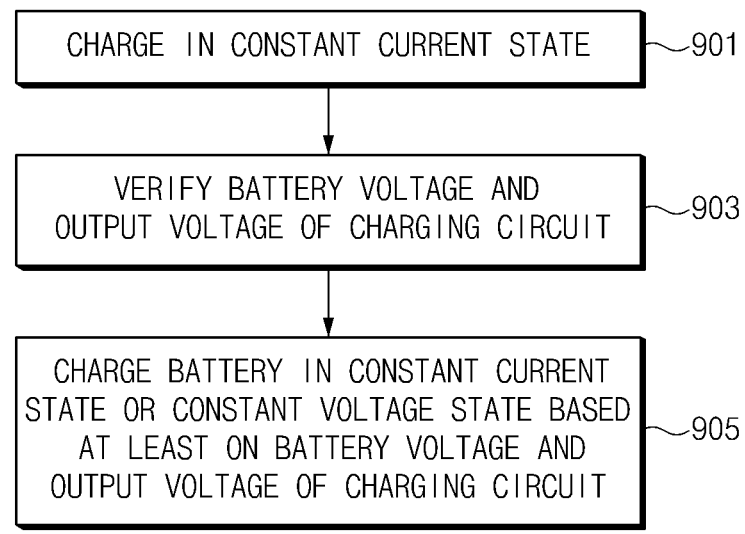
FIG. 9 is a flowchart illustrating a charging control method according to various embodiments.

FIG. 9 is a flowchart illustrating a charging control method according to various embodiments.

A description associated with operation 901 and operation 903 of FIG. 9 may be referenced by the description associated with operation 801 and operation 803 of FIG. 8. Thus, additional description will be omitted to avoid redundancy.

In operation 905, the electronic device 100 (e.g., the processor 120) may charge the battery 110 in the constant current state or the constant voltage state based at least on the battery voltage and the output voltage of the charging circuit 130. In an embodiment, in the case where a difference between the battery voltage and the output voltage is not greater than a specified value, the electronic device 100 may charge the battery 110 in the constant current state or in the constant voltage state depending on a first reference. For example, in the case where the difference between the battery voltage and the output voltage exceeds the specified value, the electronic device 100 may charge the battery 110 in the constant current state or in the constant voltage state depending on a second reference different from the first reference. For example, the first reference may include a battery voltage value. For example, the second reference may include a battery voltage value different than in the first reference. In an embodiment, in the case where a change in the battery voltage and/or a change in the output voltage verified at a specified time interval is not greater than a first value and is not smaller than a second value, the electronic device 100 may charge the battery 110 in the constant current state or in the constant voltage state by using the charging circuit 130 depending on the first reference. For example, in the case where the change in the battery voltage and/or the change in the output voltage verified at the specified time interval exceeds the first value or is smaller than the second value, the electronic device 100 may charge the battery 110 in the constant current state or in the constant voltage state depending on the second reference. For example, the first value may be not smaller than the second value. For example, one of the first value and the second value may be a value which is updated based on at least one of a change in the battery voltage or a change in the output voltage previously verified.

As described with reference to FIG. 9, in an abnormal charging situation, the battery 110 may be charged based on a reference different than in a normal charging situation. Also, in the case where the abnormal charging situation is detected, the electronic device 100 (e.g., the processor 120) may provide information about the battery state.

Figure 10:
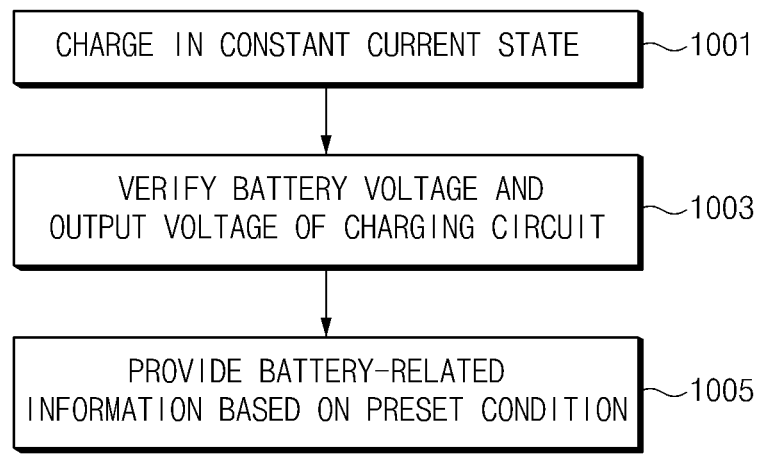
FIG. 10 is a flowchart illustrating a battery status providing method according to various embodiments.

FIG. 10 is a flowchart illustrating a battery status providing method according to various embodiments.

A description associated with operation 1001 and operation 1003 of FIG. 10 may be referenced by the description associated with operation 801 and operation 803 of FIG. 8. Thus, additional description will be omitted to avoid redundancy.

In operation 1005, the electronic device 100 (e.g., the processor 120) may charge battery-related information based on a specified condition. For example, in the case where a charging state of the battery 110 is the abnormal charging state, the electronic device 100 may provide the battery-related information. For example, in the case where the charging state of the battery 110 is the abnormal charging state, the electronic device 100 may provide information about the battery 110. For example, the electronic device 100 may detect the abnormal charging state based on the variety of references described above. In this case, the electronic device 100 may provide information indicating the abnormal charging state of the battery 110. For example, the electronic device 100 may provide visual, auditory, and/or tactile information indicating the abnormal charging state.

Figure 11:
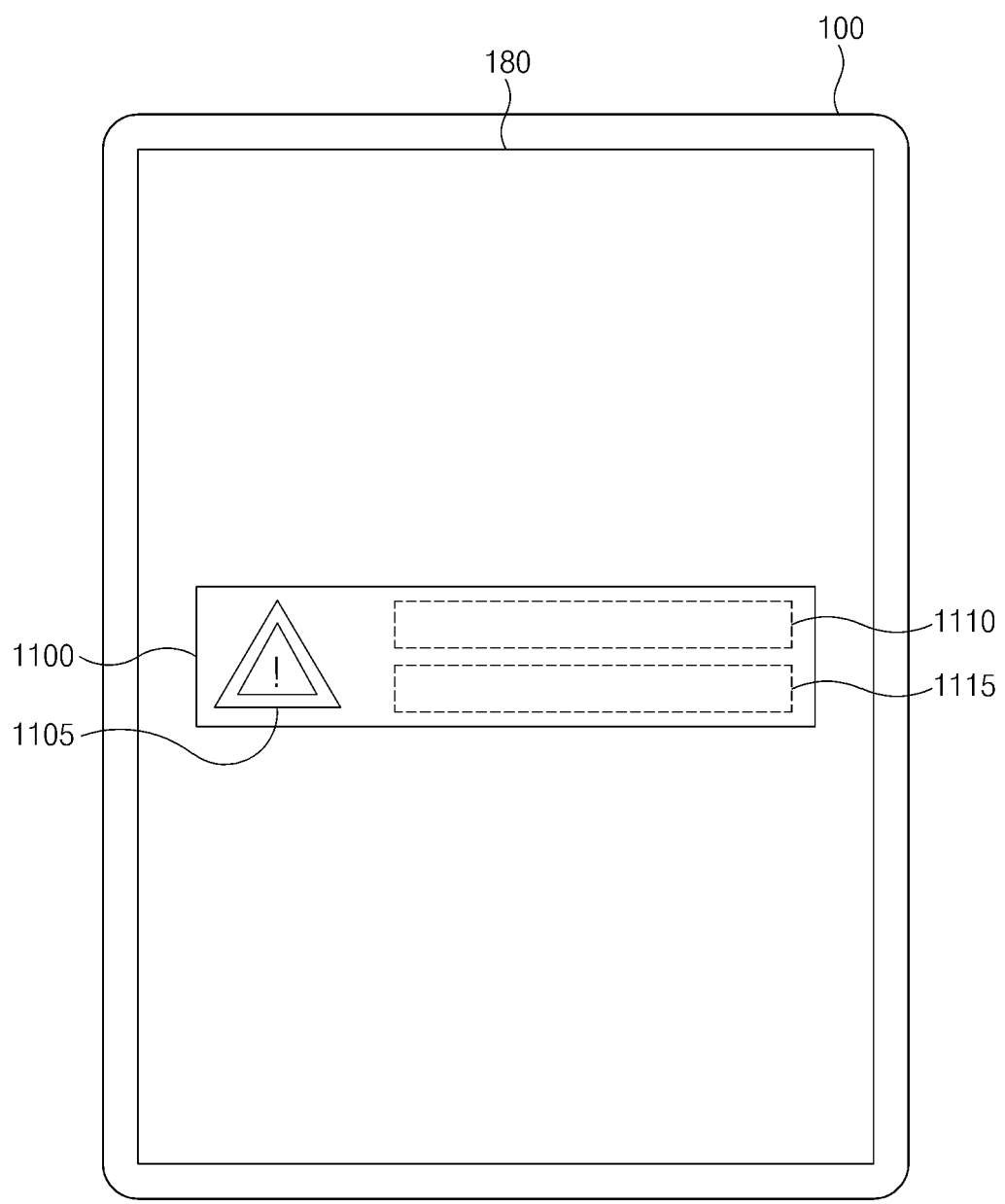
FIG. 11 is a view illustrating a notification providing screen according to various embodiments.

FIG. 11 is a view illustrating a notification providing screen according to various embodiments.

As described above, the electronic device 100 (e.g., the processor 120) may provide information associated with charging the battery 110 based on a specified condition. In an embodiment, the electronic device 100 may be configured to provide the information about the charging of the battery 110 when the abnormal charging state is detected. For example, the electronic device 100 may provide a visual, auditory, and/or tactile notification. For example, the notification may include an image, an icon, a text, an alarm, and/or a voice indicating the abnormal charging state. Also, for example, the notification may include information about a cause of the abnormal charging state. In an embodiment, a first message of a notification due to a change in the internal impedance of the battery 110 and a second message of a notification due to a change in the external impedance of the battery 110 may be differently set. Also, in an embodiment, the notification may include information about a recommended action corresponding to an abnormal charging situation.

Referring to FIG. 11, a notification 1100 is provided on the display 180 of the electronic device 100. In an embodiment of the present disclosure, the notification 1100 is illustrated as being in a visual form, but the notification 1100 may be provided together with an auditory and/or tactile notification. In an embodiment, the electronic device 100 (e.g., the processor 120) may detect the abnormal charging state due to a change in the external impedance of the battery 110 and may provide the notification 1100 so as to cope with the abnormal charging state.

In an embodiment, the notification 1100 may include a specified background image and information on the background image. For example, the notification 1100 may be provided in the form of a pop-up message. In the exemplification of FIG. 11, the notification 1100 may include an icon 1105, a first display region 1110, and a second display region 1115.

In an embodiment, the icon 1105 may correspond to an icon (e.g., an exclamation mark or the like) indicating a notification, an icon (e.g., an icon of the form of the battery 110, an icon of the form of the electronic device 100, or an icon of the form of a connector) corresponding to a component giving cause for the notification, or an icon associated with a required user action (e.g., exchange of a battery or reconnection of a connector).

In an embodiment, the information about the abnormal charging state may be displayed in the first display region 1110. For example, the information about the abnormal charging state may include information instructing an abnormal state of the battery 110 or the electronic device 100, or information (e.g., the external impedance (e.g., the first impedance 171) of the battery 110 or the internal impedance (e.g., the second impedance 172) of the battery 110) directly or indirectly instructing a cause of the abnormal charging state.

In an embodiment, the information about an action (hereinafter referred to as a "correspondence action") corresponding to the abnormal charging state may be displayed in the second display region 1115. For example, the information about the correspondence action may correspond to information instructing disconnection of the connector from the electronic device 100, reconnection of the connector to the electronic device 100, exchange of the battery 110, or power-off of the electronic device 100. In an embodiment, the information about the correspondence action may include information (e.g., information about the power-off of the electronic device 100) instructing an operation of the electronic device 100 corresponding to the detected abnormal charging state.

In an embodiment, the electronic device 100 (e.g., the processor 120) may detect the abnormal charging state due to the abnormal external impedance (e.g., the first impedance 171) of the battery 110 and may display a notification (e.g., the notification 1100) corresponding to the detected abnormal charging state on the display 180. For example, the electronic device 100 may display an icon of the form of the battery 110, an icon of the form of the electronic device 100, an icon of the form of a connector, or an icon corresponding to reconnection of a connector, as the icon 1105. For example, the electronic device 100 may display information (e.g., "battery connection is incomplete") indicating that abnormal charging is performed, on the first display region 1110. For example, the electronic device 100 may display information (e.g., "you need to reconnect a battery after disconnection from a cellular phone") associated with the correspondence action for the user on the second display region 1115.

In an embodiment, the electronic device 100 (e.g., the processor 120) may detect the abnormal charging state due to the abnormal internal impedance (e.g., the second impedance 172) of the battery 110 and may display a notification (e.g., the notification 1100) corresponding to the detected abnormal charging state on the display 180. For example, the electronic device 100 may display an icon of the form of the battery 110, an icon of the form of the electronic device 100, or an icon corresponding to exchange of the battery 110, as the icon 1105. For example, the electronic device 100 may display information (e.g., "an abnormal battery state is detected") indicating that abnormal charging is performed, on the first display region 1110. For example, the electronic device 100 may display information (e.g., "please replace a battery") associated with the correspondence action for the user on the second display region 1115.

The notification 1100 of FIG. 11 is exemplary, and the notification 1100 is not limited to the embodiment of the form of FIG. 11 and the description given with reference to FIG. 11. In an embodiment, the notification 1100 may include at least one of the icon 1105, the first display region 1110, or the second display region 1115. In an embodiment, visual elements (e.g., the icon 1105, the first display region 1110, or the second display region 1115) included in the notification 1100 may be displayed at a position different than in FIG. 11.

As described above, an electronic device (e.g., the electronic device 100) according to the present disclosure may include a battery (e.g., the battery 110), a first detection circuit (e.g., the first detection circuit 141) that detects a voltage of the battery, a charging circuit (e.g., the charging circuit 130) that charges the battery in a constant current state or a constant voltage state based on the voltage of the battery, a second detection circuit (e.g., the second detection circuit 142) that detects an output voltage of the charging circuit, and a processor (e.g., the processor 120). The processor may verify the voltage of the battery by using the first detection circuit and the output voltage by using the second detection circuit while the battery is charged in the constant current state, and may determine a state of the battery based at least on the voltage of the battery and the output voltage.

The processor according to an embodiment may determine the state of the battery as a normal charging state when a difference between the voltage of the battery and the output voltage is smaller than a specified first value and may determine the state of the battery as an abnormal charging state when the difference between the voltage of the battery and the output voltage is not smaller than the specified first value.

In an embodiment, when the state of the battery is determined as the normal charging state, the processor may charge the battery in the constant voltage state when the voltage of the battery is not smaller than a specified value and may charge the battery in the constant current state when the voltage of the battery is smaller than the specified value.

The processor according to an embodiment may perform the verifying of the voltage of the battery and the output voltage at a specified time interval and may determine the state of the battery based on at least one of a change in the battery voltage or a change in the output voltage verified at the specified time interval.

The processor according to an embodiment may determine the state of the battery by comparing at least one of the change in the battery voltage or the change in the output voltage with a specified second value.

In an embodiment, the specified second value may be updated based on at least one of a change in the battery voltage or a change in the output voltage previously verified.

When the state of the battery is determined as an abnormal charging state, the processor according to an embodiment may charge the battery in the constant current state or the constant voltage state based on a reference different than in the case where the state of the battery is a normal charging state, by using the charging circuit.

The charging circuit according to an embodiment may detect a charging amount of the battery, and when the state of the battery is determined as the abnormal charging state, the processor may charge the battery in the constant current state or the constant voltage state based on the charging amount of the battery, by using the charging circuit.

The processor according to an embodiment may charge the battery in the constant current state or the constant voltage state by comparing the voltage of the battery with a specified first value, when the state of the battery is determined as the normal charging state, and may charge the battery in the constant current state or the constant voltage state by comparing the voltage of the battery with a specified second value different from the specified first value, when the state of the battery is determined as the normal charging state.

The processor according to an embodiment may charge the battery in the constant voltage state independently of the voltage of the battery, by using the charging circuit, when the state of the battery is determined as an abnormal charging state.

The electronic device may further include a display device. The processor may provide information associated with a charging state of the battery by using the display device, when the state of the battery is determined as an abnormal charging state.

In an embodiment, the information associated with the charging state of the battery may include information indicating at least one of the abnormal charging state or an instruction corresponding to the abnormal charging state.

The electronic device according to an embodiment may further include a sound output device.

The processor may provide information associated with a charging state of the battery by using the sound output device, when the state of the battery is determined as an abnormal charging state.

As described above, an electronic device (e.g., the electronic device 100) disclosed in the present disclosure may include a battery (e.g., the battery 110), a first detection circuit (e.g., the first detection circuit 141) that detects a voltage of the battery, a charging circuit (e.g., the charging circuit 130) that charges the battery in a constant current state or a constant voltage state based on the voltage of the battery, a second detection circuit (e.g., the second detection circuit 142) that detects an output voltage of the charging circuit, and a processor (e.g., the processor 120). The processor may verify the voltage of the battery and the output voltage by using the first detection circuit and the second detection circuit, respectively, while the battery is charged in the constant current state, may charge the battery in the constant current state or the constant voltage state depending on a first reference by using the charging circuit, when a difference between the output voltage and the battery voltage is not greater than a specified value, and may charge the battery in the constant current state or the constant voltage state depending on a second reference different from the first reference by using the charging circuit, when the difference between the output voltage and the battery voltage exceeds the specified value. The first reference may include a first battery voltage value.

In an embodiment, the second reference may include at least one of a second battery voltage value different from the first battery voltage value or a charging amount of the battery.

The processor according to an embodiment may perform the verifying of the voltage of the battery and the output voltage at a specified time interval, may charge the battery in the constant current state or the constant voltage state depending on the first reference by using the charging circuit, when a change in the battery voltage and a change in the output voltage verified at the specified time interval is not greater than a specified first value and is not smaller than a specified second value, and may charge the battery in the constant current state or the constant voltage state depending on the second reference by using the charging circuit, when the change in the battery voltage or the change in the output voltage verified at the specified time interval exceeds the specified first value or is smaller than the specified second value. The first value may be greater than the second value.

In an embodiment, at least one of the specified first value or the specified second value may be updated based on at least one a change in the battery voltage or a change in the output voltage previously verified.

As described above, an electronic device (e.g., the electronic device 100) disclosed in the present disclosure may include a battery (e.g., the battery 110), a first detection circuit (e.g., the first detection circuit 141) that detects a voltage of the battery, a charging circuit (e.g., the charging circuit 130) that charges the battery in a constant current state or a constant voltage state based on the voltage of the battery, a second detection circuit (e.g., the second detection circuit 142) that detects an output voltage of the charging circuit, a display (e.g., the display 180), and a processor (e.g., the processor 120). The processor may periodically verify the voltage of the battery and the output voltage by using the first detection circuit and the second detection circuit, respectively, while the battery is charged in the constant current state, and may provide information about a charging state of the battery through the display based on at least one of a difference between the voltage of the battery and the output voltage, the change in the voltage of the battery periodically verified, or the change in the output voltage periodically verified.

The processor according to an embodiment may provide the information about the charging state of the battery through the display based on at least one of the change in the voltage of the battery periodically verified or the change in the output voltage periodically verified.

In an embodiment, the information about the charging state of the battery may include information indicating at least one of an abnormal charging state or an instruction corresponding to the abnormal charging state.

Below, a configuration of the electronic device 100 for performing the embodiments described with reference to FIGS. 1 to 11 will be described with reference to FIGS. 12 and 13.

Figure 12:
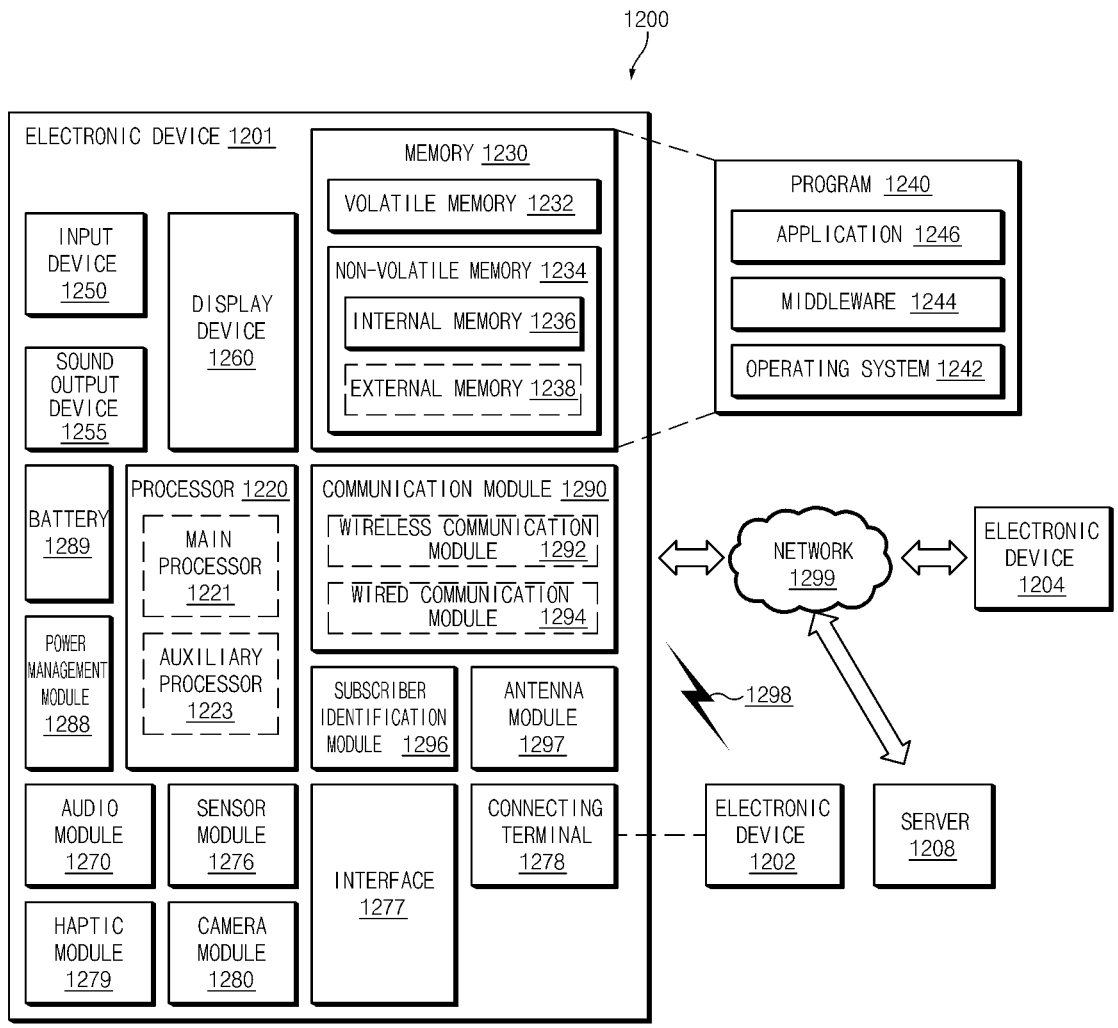
FIG. 12 is a block diagram of an electronic device in a network environment according to various embodiments.

FIG. 12 is a block diagram of an electronic device 1201 (e.g., the electronic device 100) in a network environment 1200 according to various embodiments. Referring to FIG. 12, the electronic device 1201 may communicate with an electronic device 1202 through a first network 1298 (e.g., a short-range wireless communication) or may communicate with an electronic device 1204 or a server 1208 through a second network 1299 (e.g., a long-distance wireless communication) in the network environment 1200. According to an embodiment, the electronic device 1201 may communicate with the electronic device 1204 through the server 1208. According to an embodiment, the electronic device 1201 may include a processor 1220 (e.g., the processor 120), a memory 1230, an input device 1250, a sound output device 1255, a display device 1260 (e.g., the display 180), an audio module 1270, a sensor module 1276, an interface 1277, a haptic module 1279, a camera module 1280, a power management module 1288 (e.g., the charging circuit 130 and the detection circuit 140), a battery 1289 (e.g., the battery 110), a communication module 1290, a subscriber identification module 1296, and an antenna module 1297. According to some embodiments, at least one (e.g., the display device 1260 or the camera module 1280) among components of the electronic device 1201 may be omitted or other components may be added to the electronic device 1201. According to some embodiments, some components may be integrated and implemented as in the case of the sensor module 1276 (e.g., a fingerprint sensor, an iris sensor, or an illuminance sensor) embedded in the display device 1260 (e.g., a display).

The processor 1220 may operate, for example, software (e.g., a program 1240) to control at least one of other components (e.g., a hardware or software component) of the electronic device 1201 connected to the processor 1220 and may process and compute a variety of data. The processor 1220 may load a command set or data, which is received from other components (e.g., the sensor module 1276 or the communication module 1290), into a volatile memory 1232, may process the loaded command or data, and may store result data into a nonvolatile memory 1234. According to an embodiment, the processor 1220 may include a main processor 1221 (e.g., a central processing unit or an application processor) and an coprocessor 1223 (e.g., a graphic processing device, an image signal processor, a sensor hub processor, or a communication processor), which operates independently from the main processor 1221, additionally or alternatively uses less power than the main processor 1221, or is specified to a designated function. In this case, the coprocessor 1223 may operate separately from the main processor 1221 or embedded.

In this case, the coprocessor 1223 may control, for example, at least some of functions or states associated with at least one component (e.g., the display device 1260, the sensor module 1276, or the communication module 1290) among the components of the electronic device 1201 instead of the main processor 1221 while the main processor 1221 is in an inactive (e.g., sleep) state or together with the main processor 1221 while the main processor 1221 is in an active (e.g., an application execution) state. According to an embodiment, the coprocessor 1223 (e.g., the image signal processor or the communication processor) may be implemented as a part of another component (e.g., the camera module 1280 or the communication module 1290) that is functionally related to the coprocessor 1223. The memory 1230 may store a variety of data used by at least one component (e.g., the processor 1220 or the sensor module 1276) of the electronic device 1201, for example, software (e.g., the program 1240) and input data or output data with respect to commands associated with the software. The memory 1230 may include the volatile memory 1232 or the nonvolatile memory 1234.

The program 1240 may be stored in the memory 1230 as software and may include, for example, an operating system 1242, a middleware 1244, or an application 1246.

The input device 1250 may be a device for receiving a command or data, which is used for a component (e.g., the processor 1220) of the electronic device 1201, from an outside (e.g., a user) of the electronic device 1201 and may include, for example, a microphone, a mouse, or a keyboard.

The sound output device 1255 may be a device for outputting a sound signal to the outside of the electronic device 1201 and may include, for example, a speaker used for general purposes, such as multimedia play or recordings play, and a receiver used only for receiving calls. According to an embodiment, the receiver and the speaker may be either integrally or separately implemented.

The display device 1260 may be a device for visually presenting information to the user and may include, for example, a display, a hologram device, or a projector and a control circuit for controlling a corresponding device. According to an embodiment, the display device 1260 may include a touch circuitry or a pressure sensor for measuring an intensity of pressure on the touch.

The audio module 1270 may convert a sound and an electrical signal in dual directions. According to an embodiment, the audio module 1270 may obtain the sound through the input device 1250 or may output the sound through an external electronic device (e.g., the electronic device 1202 (e.g., a speaker or a headphone)) wired or wirelessly connected to the sound output device 1255 or the electronic device 1201.

The sensor module 1276 may generate an electrical signal or a data value corresponding to an operating state (e.g., power or temperature) inside or an environmental state outside the electronic device 1201. The sensor module 1276 may include, for example, a gesture sensor, a gyro sensor, a barometric pressure sensor, a magnetic sensor, an acceleration sensor, a grip sensor, a proximity sensor, a color sensor, an infrared sensor, a biometric sensor, a temperature sensor, a humidity sensor, or an illuminance sensor.

The interface 1277 may support a designated protocol wired or wirelessly connected to the external electronic device (e.g., the electronic device 1202). According to an embodiment, the interface 1277 may include, for example, an HDMI (high-definition multimedia interface), a USB (universal serial bus) interface, an SD card interface, or an audio interface.

A connection terminal 1278 may include a connector that physically connects the electronic device 1201 to the external electronic device (e.g., the electronic device 1202), for example, an HDMI connector, a USB connector, an SD card connector, or an audio connector (e.g., a headphone connector).

The haptic module 1279 may convert an electrical signal to a mechanical stimulation (e.g., vibration or movement) or an electrical stimulation perceived by the user through tactile or kinesthetic sensations. The haptic module 1279 may include, for example, a motor, a piezoelectric element, or an electric stimulator.

The camera module 1280 may shoot a still image or a video image. According to an embodiment, the camera module 1280 may include, for example, at least one lens, an image sensor, an image signal processor, or a flash.

The power management module 1288 may be a module for managing power supplied to the electronic device 1201 and may serve as at least a part of a power management integrated circuit (PMIC).

The battery 1289 may be a device for supplying power to at least one component of the electronic device 1201 and may include, for example, a non-rechargeable (primary) battery, a rechargeable (secondary) battery, or a fuel cell.

The communication module 1290 may establish a wired or wireless communication channel between the electronic device 1201 and the external electronic device (e.g., the electronic device 1202, the electronic device 1204, or the server 1208) and support communication execution through the established communication channel. The communication module 1290 may include at least one communication processor operating independently from the processor 1220 (e.g., the application processor) and supporting the wired communication or the wireless communication. According to an embodiment, the communication module 1290 may include a wireless communication module 1292 (e.g., a cellular communication module, a short-range wireless communication module, or a GNSS (global navigation satellite system) communication module) or a wired communication module 1294 (e.g., an LAN (local area network) communication module or a power line communication module) and may communicate with the external electronic device using a corresponding communication module among them through the first network 1298 (e.g., the short-range communication network such as a Bluetooth, a WiFi direct, or an IrDA (infrared data association)) or the second network 1299 (e.g., the long-distance wireless communication network such as a cellular network, an internet, or a computer network (e.g., LAN or WAN)). The above-mentioned various communication modules 1290 may be implemented into one chip or into separate chips, respectively.

According to an embodiment, the wireless communication module 1292 may identify and authenticate the electronic device 1201 using user information stored in the subscriber identification module 1296 in the communication network.

The antenna module 1297 may include one or more antennas to transmit or receive the signal or power to or from an external source. According to an embodiment, the communication module 1290 (e.g., the wireless communication module 1292) may transmit or receive the signal to or from the external electronic device through the antenna suitable for the communication method.

Some components among the components may be connected to each other through a communication method (e.g., a bus, a GPIO (general purpose input/output), an SPI (serial peripheral interface), or an MIPI (mobile industry processor interface)) used between peripheral devices to exchange signals (e.g., a command or data) with each other.

According to an embodiment, the command or data may be transmitted or received between the electronic device 1201 and the external electronic device 1204 through the server 1208 connected to the second network 1299. Each of the electronic devices 1202 and 1204 may be the same or different types as or from the electronic device 1201. According to an embodiment, all or some of the operations performed by the electronic device 1201 may be performed by another electronic device or a plurality of external electronic devices. When the electronic device 1201 performs some functions or services automatically or by request, the electronic device 1201 may request the external electronic device to perform at least some of the functions related to the functions or services, in addition to or instead of performing the functions or services by itself. The external electronic device receiving the request may carry out the requested function or the additional function and transmit the result to the electronic device 1201. The electronic device 1201 may provide the requested functions or services based on the received result as is or after additionally processing the received result. To this end, for example, a cloud computing, distributed computing, or client-server computing technology may be used.

The electronic device 1201 of FIG. 12 may correspond to the electronic device 100 described with reference to FIGS. 1 to 11. For example, the battery 1289 may correspond to the battery 110 described with reference to FIGS. 1 to 11. Also, the display device 1260 may correspond to the display 180 described above. For example, the processor 1223 may correspond to the processor 120 described above. Also, the power management module 1288 may include the charging circuit 130, the power regulator 150, the detection circuit 140, and/or the first detection circuit 141. For example, the second detection circuit 142 may be included in the power management module 1288 or may be implemented as a component different from the power management module 1288.

Figure 13:
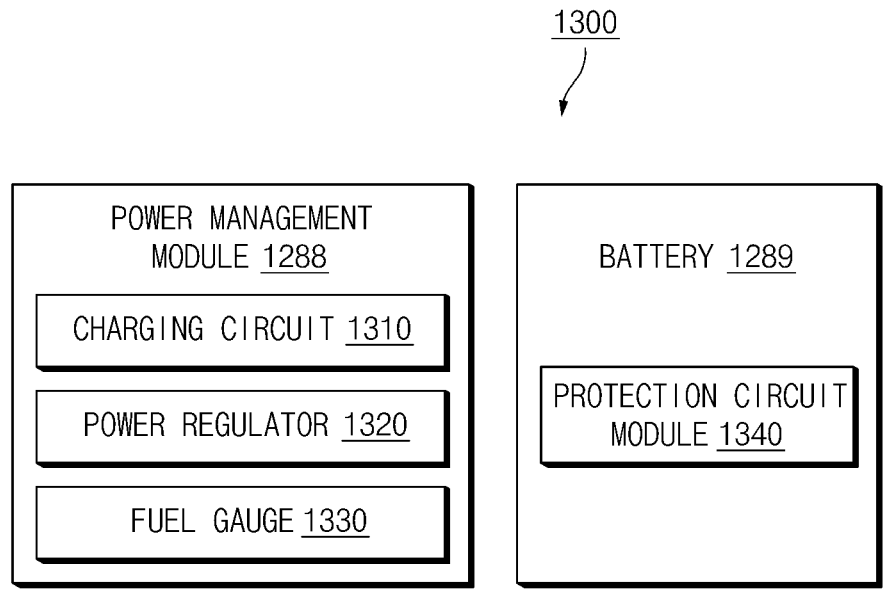
FIG. 13 is a block diagram illustrating a power management module and a battery of an electronic device according to various embodiments.

FIG. 13 is a block diagram 1300 illustrating the wireless communication module 1288 and the battery 1289 (e.g., the battery 110), according to various embodiments. Referring to FIG. 13, the power management module 1288 may include a charging circuit 1310 (e.g., the charging circuit 130), a power regulator 1320 (e.g., the power regulator 150), or a fuel gauge 1330 (e.g., the detection circuit 140, the first detection circuit 141, and/or the second detection circuit 142). The charging circuit 1310 may charge the battery 1289 by using a power supplied from an external power source (e.g., the power supply source 200) for the electronic device 1201 (e.g., the electronic device 100). According to an embodiment, the charging circuit 1310 may select a charging manner (e.g., normal charging or quick charging) based at least on a kind (e.g., power adapter, USB or wireless charging) of the external power source, the magnitude (e.g., approximately 20 Watt or more) of the power which may be supplied from the external power source, or attributes of the battery 1289, and may charge the battery 1289 by using the selected charging manner. For example, the external power source may be wiredly connected through the connection terminal 1278 or may be wirelessly connected through antenna module 1297.

The power regulator 1320 may generate another voltage or a plurality of powers having different current levels by regulating a voltage level or a current level of the external power or the power supplied from the battery 1289. The power regulator 1320 may regulate the external power or the power of the battery 1289 to a voltage or current level suitable for each component included in the electronic device 1201. According to an embodiment, the power regulator 1320 may be implemented in the form of a low drop out (LDO) regulator or a switching regulator.

The fuel gauge 1330 may measure information (e.g., a capacity, a charging/discharging count, a voltage, or a temperature of a battery) about a usage state of the battery 1289.

For example, the power management module 1288 may determine charging state information (e.g., lifetime, overvoltage, low voltage, overcurrent, overcharging, over discharge, over-heating, short circuit, or swelling) associated with charging the battery 1289 based at least on the usage state information measured by using the charging circuit 1310, the power regulator 1320, or the fuel gauge 1330, may determine whether the battery 1289 is in an abnormal state or in a normal state, based at least on the determined charging state information, and may regulate the charging of the battery 1289 (e.g., may decrease a charging current or voltage or may stop charging) when the abnormal state is determined. According to an embodiment, at least a part of functions of the power management module 1288 may be performed by an external control device (e.g., the processor 1220).

According to an embodiment, the battery 1289 may include a protection circuit module (PCM) 1340 (e.g., the first protection circuit 113 and/or the second protection circuit 114). The protection circuit module 1340 may perform various functions (e.g., a pre-prevention function) for the purpose of preventing reduction of performance of the battery 1289 or burning of the battery 1289. The protection circuit module 1340 may be implemented as, additionally or in alternative to, at least a part of a battery management system (BMS) for cell balancing and for measuring a capacity, a charging/discharging count, a temperature, or a voltage of a battery.

According to an embodiment, the usage state information of the battery 1289 or at least a portion of the charging state information may be measured by using the fuel gauge 1330, the power management module 1288, or a relevant sensor (e.g., a temperature sensor) in the sensor module 1276. In this case, according to an embodiment, the relevant sensor (e.g., a temperature sensor) in the sensor module 1276 may be included as a part of the protection circuit module 1340 or may be positioned in the vicinity of the battery 1289 as a device independently of the protection circuit module 1340.

The components of FIG. 13 may correspond to various components of the electronic device 100 described with reference to FIGS. 1 to 11. For example, the charging circuit 1310 may correspond to the above-described charging circuit 130. Also, the power regulator 1320 may correspond to the power regulator 150. Also, for example, the fuel gauge 1330 may correspond to the detection circuit 140, the first detection circuit 141, and/or the second detection circuit 142. For example, the second detection circuit 142 may be included in the fuel gauge 1330 or may be implemented as a component independent of the fuel gauge 1330.

The electronic device according to various embodiments disclosed in the present disclosure may be various types of devices. The electronic device may include, for example, at least one of a portable communication device (e.g., a smartphone), a computer device, a portable multimedia device, a mobile medical appliance, a camera, a wearable device, or a home appliance. The electronic device according to an embodiment of the present disclosure should not be limited to the above-mentioned devices.

It should be understood that various embodiments of the present disclosure and terms used in the embodiments do not intend to limit technologies disclosed in the present disclosure to the particular forms disclosed herein; rather, the present disclosure should be construed to cover various modifications, equivalents, and/or alternatives of embodiments of the present disclosure. With regard to description of drawings, similar components may be assigned with similar reference numerals. As used herein, singular forms may include plural forms as well unless the context clearly indicates otherwise. In the present disclosure disclosed herein, the expressions "A or B", "at least one of A or/and B", "A, B, or C" or "one or more of A, B, or/and C", and the like used herein may include any and all combinations of one or more of the associated listed items. The expressions "a first", "a second", "the first", or "the second", used in herein, may refer to various components regardless of the order and/or the importance, but do not limit the corresponding components. The above expressions are used merely for the purpose of distinguishing a component from the other components. It should be understood that when a component (e.g., a first component) is referred to as being (operatively or communicatively) "connected," or "coupled," to another component (e.g., a second component), it may be directly connected or coupled directly to the other component or any other component (e.g., a third component) may be interposed between them.

The term "module" used herein may represent, for example, a unit including one or more combinations of hardware, software and firmware. The term "module" may be interchangeably used with the terms "logic", "logical block", "part" and "circuit". The "module" may be a minimum unit of an integrated part or may be a part thereof. The "module" may be a minimum unit for performing one or more functions or a part thereof. For example, the "module" may include an application-specific integrated circuit (ASIC).

Various embodiments of the present disclosure may be implemented by software (e.g., the program 1240) including an instruction stored in a machine-readable storage media (e.g., an internal memory 1236 or an external memory 1238) readable by a machine (e.g., a computer). The machine may be a device that calls the instruction from the machine-readable storage media and operates depending on the called instruction and may include the electronic device (e.g., the electronic device 1201). When the instruction is executed by the processor (e.g., the processor 1220), the processor may perform a function corresponding to the instruction directly or using other components under the control of the processor. The instruction may include a code generated or executed by a compiler or an interpreter. The machine-readable storage media may be provided in the form of non-transitory storage media. Here, the term "non-transitory", as used herein, is a limitation of the medium itself (i.e., tangible, not a signal) as opposed to a limitation on data storage persistency.

According to an embodiment, the method according to various embodiments disclosed in the present disclosure may be provided as a part of a computer program product. The computer program product may be traded between a seller and a buyer as a product. The computer program product may be distributed in the form of machine-readable storage medium (e.g., a compact disc read only memory (CD-ROM)) or may be distributed only through an application store (e.g., a Play Store™). In the case of online distribution, at least a portion of the computer program product may be temporarily stored or generated in a storage medium such as a memory of a manufacturer's server, an application store's server, or a relay server.

Each component (e.g., the module or the program) according to various embodiments may include at least one of the above components, and a portion of the above sub-components may be omitted, or additional other sub-components may be further included. Alternatively or additionally, some components (e.g., the module or the program) may be integrated in one component and may perform the same or similar functions performed by each corresponding components prior to the integration. Operations performed by a module, a programming, or other components according to various embodiments of the present disclosure may be executed sequentially, in parallel, repeatedly, or in a heuristic method. Also, at least some operations may be executed in different sequences, omitted, or other operations may be added.

What is claimed is:

1. An electronic device comprising:
a battery;
a first detection circuit configured to detect a voltage of the battery;
a charging circuit configured to charge the battery in a constant current state or a constant voltage state based on the voltage of the battery;
a second detection circuit configured to detect an output voltage of the charging circuit; and
a processor,
wherein the processor is configured to:
verify the voltage of the battery and the output voltage by using the first detection circuit and the second detection circuit, respectively, while the battery is charged in the constant current state;
charge the battery in the constant current state or the constant voltage state depending on a first reference by using the charging circuit, when a difference between the output voltage and the voltage of the battery is not greater than a specified value; and
charge the battery in the constant current state or the constant voltage state depending on a second reference different from the first reference by using the charging circuit, when the difference between the output voltage and the voltage of the battery exceeds the specified value, and
wherein the first reference includes a first battery voltage value.

2. The electronic device of claim 1, wherein the second reference includes at least one of a second battery voltage value different from the first battery voltage value or a charging amount of the battery.

3. The electronic device of claim 2, wherein the processor is configured to:
perform the verifying of the voltage of the battery and the output voltage at a specified time interval;
charge the battery in the constant current state or the constant voltage state depending on the first reference by using the charging circuit, when a change in the voltage of the battery and a change in the output voltage verified at the specified time interval are not greater than a specified first value and is not smaller than a specified second value; and
charge the battery in the constant current state or the constant voltage state depending on the second reference by using the charging circuit, when the change in the voltage of the battery or the change in the output voltage verified at the specified time interval exceeds the specified first value and is smaller than the specified second value, and
wherein the specified first value is greater than the specified second value.

4. The electronic device of claim 3, wherein at least one of the specified first value or the specified second value is updated based on at least one a change in the voltage of the battery or a change in the output voltage previously verified.

5. An electronic device comprising:
a battery;
a first detection circuit configured to detect a voltage of the battery;
a charging circuit configured to charge the battery in a constant current state or a constant voltage state based on the voltage of the battery;
a second detection circuit configured to detect an output voltage of the charging circuit; and
a processor,
wherein the processor is configured to:
identify a first change rate of the voltage of the battery by using the first detection circuit and a second change rate of the output voltage by using the second detection circuit, while the battery is charged in the constant current state; and
determine a state of the battery as an abnormal charging state when at least one of the first change rate and the second change rate exceeds a specified range.

6. The electronic device of claim 5, wherein the processor is configured to:
identify the voltage of the battery and the output voltage at a specified time interval; and
identify the first change rate and the second change rate over the specified time interval.

7. The electronic device of claim 5, wherein the specified range is updated based on at least one of a change in the voltage of the battery or a change in the output voltage previously identified.

8. The electronic device of claim 5, wherein the charging circuit is configured to detect a charging amount of the battery, and
wherein the processor is configured to:
when the state of the battery is determined as the abnormal charging state, charge the battery in the constant current state or the constant voltage state based on the charging amount of the battery, by using the charging circuit.

9. The electronic device of claim 5, wherein the processor is configured to:
when the state of the battery is determined as the abnormal charging state, charge the battery in the constant voltage state independently of the voltage of the battery, by using the charging circuit.

10. The electronic device of claim 5, further comprising:
a display device,
wherein the processor is configured to:
when the state of the battery is determined as the abnormal charging state, provide information associated with a charging state of the battery by using the display device.

11. The electronic device of claim 5, wherein the processor is configured to:
identify the voltage of the battery by using the first detection circuit and the output voltage by using the second detection circuit, while the battery is charged in the constant current state;
determine the state of the battery as a normal charging state when a difference between the voltage of the battery and the output voltage is smaller than a specified first value; and
determine the state of the battery as the abnormal charging state when the difference between the voltage of the battery and the output voltage is not smaller than the specified first value.

12. The electronic device of claim 11, wherein, when the state of the battery is determined as the normal charging state, the processor is configured to:
- charge the battery in the constant voltage state when the voltage of the battery is not smaller than a specified value; and
- charge the battery in the constant current state when the voltage of the battery is smaller than the specified value.

13. The electronic device of claim 11, wherein the processor is configured to determine the abnormal charging state due to an internal impedance of the battery, when at least one of the first change rate and the second change rate exceeds the specified range.

14. The electronic device of claim 11, wherein the processor is configured to determine the abnormal charging state due to an external impedance of the battery, when the difference between the voltage of the battery and the output voltage is not smaller than the specified first value.

15. The electronic device of claim 5, wherein the processor is configured to:
- when the state of the battery is determined as a normal charging state, charge the battery in the constant current state or the constant voltage state based on a comparison between the voltage of the battery and a specified first value; and
- when the state of the battery is determined as the abnormal charging state, charge the battery in the constant current state or the constant voltage state based on a comparison between the voltage of the battery and a specified second value different from the specified first value.

* * * * *